(12) United States Patent (10) Patent No.: US 12,422,509 B2
Yang et al. (45) Date of Patent: Sep. 23, 2025

(54) BALUN PACKAGE COMPRISING MULTIPLE INDUCTIVE BALUNS FOR AN MRI RF COIL

(71) Applicant: Quality Electrodynamics, LLC, Mayfield Village, OH (US)

(72) Inventors: Xiaoyu Yang, Indiana, PA (US); Thomas Eastlake, Cleveland, OH (US); Tsinghua Zheng, Chesterland, OH (US); Matthew Finnerty, University Heights, OH (US)

(73) Assignee: Quality Electrodynamics, LLC, Mayfield Village, OH (US)

( * ) Notice: Subject to any disclaimer, the term of this patent is extended or adjusted under 35 U.S.C. 154(b) by 190 days.

(21) Appl. No.: 18/469,640

(22) Filed: Sep. 19, 2023

(65) Prior Publication Data

US 2024/0103107 A1 Mar. 28, 2024

Related U.S. Application Data

(60) Provisional application No. 63/408,565, filed on Sep. 21, 2022.

(51) Int. Cl.
*G01R 33/36* (2006.01)
(52) U.S. Cl.
CPC ............... *G01R 33/3657* (2013.01)
(58) Field of Classification Search
CPC ............ G01R 33/3657; G01R 33/3685
See application file for complete search history.

(56) References Cited

U.S. PATENT DOCUMENTS

| 4,682,125 A | 7/1987 | Harrison et al. |
| 4,825,162 A | 4/1989 | Roemer et al. |
| 2003/0094950 A1 | 5/2003 | Burl et al. |
| 2004/0189300 A1* | 9/2004 | Burl ............... G01R 33/3415 324/318 |
| 2008/0238568 A1* | 10/2008 | Davies-venn ............ H03H 7/42 333/25 |

OTHER PUBLICATIONS

Chen et al. "Biomedical Magnetic Resonance Technology." Institute of Physics Publishing, pp. 138-139, published in 1989.
Wang, Jianmin. "A Novel Method to Reduce the Signal Coupling of Surface Coils for MRI." Proc. ISMRM 4:1434, published in 1996.
Corea, Joseph. "Screen Printed MRI Receive Coils." Electrical Engineering and Computer Sciences University of California at Berkeley, published on Dec. 1, 2018.

* cited by examiner

*Primary Examiner* — G. M. A Hyder
(74) *Attorney, Agent, or Firm* — Eschweiler & Potashnik, LLC

(57) ABSTRACT

The present disclosure is directed to a balun package comprising a set of inductive baluns for a magnetic resonance imaging (MRI) radio frequency (RF) coil. A first resonant circuit and a second resonant circuit each comprise an inductor. A first decoupling circuit leg is between and shared by the first and second resonant circuits and includes one or more decoupling inductors and/or one or more decoupling capacitors. A first cable bundle is wound to form the inductor of the first resonant circuit or is otherwise spaced from and inductively coupled to the inductor of the first resonant circuit.

20 Claims, 14 Drawing Sheets

BALUN PACKAGE COMPRISING MULTIPLE INDUCTIVE BALUNS FOR AN MRI RF COIL

REFERENCE TO RELATED APPLICATION

This application claims the benefit of U.S. Provisional Application No. 63/408,565, filed on Sep. 21, 2022, the contents of which are hereby incorporated herein by reference in their entirety.

BACKGROUND

Magnetic resonance imaging (MRI) involves the transmission and receipt of radio frequency (RF) energy. RF energy may be transmitted by an RF coil to create a $B_1$ field that rotates a net magnetization. Further, resulting magnetic resonance (MR) signals may be received by an RF coil to detect precessing transverse magnetization. Thus, RF coils may be transmit (Tx) coils, receive (Rx) coils, or transmit and receive (Tx/Rx) coils.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. It is further noted that the examples portrayed in the figures should not be considered as the only embodiments covered by the present disclosure.

DETAILED DESCRIPTION

Figure 1:
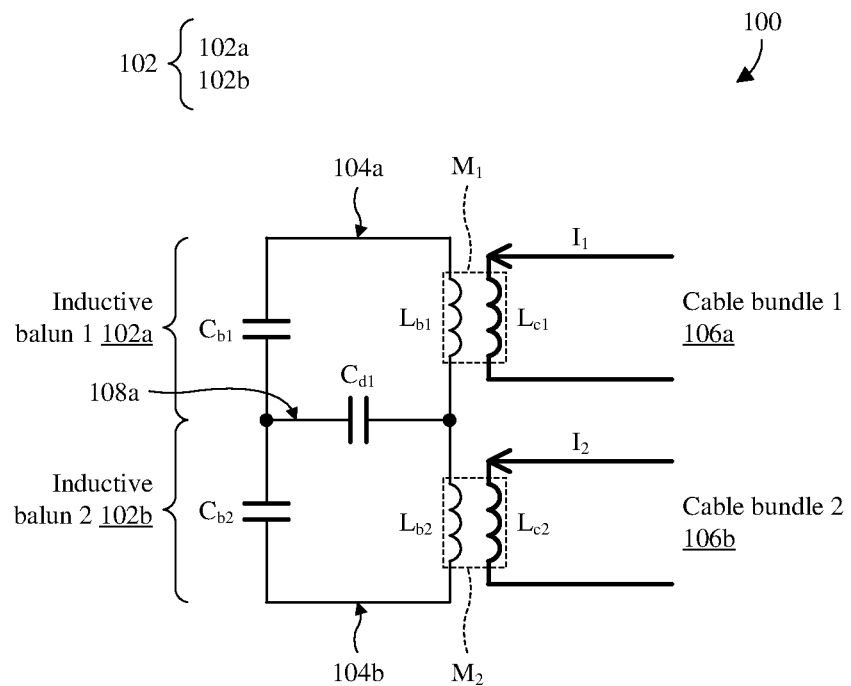
FIG. 1 illustrates a circuit diagram of some embodiments of a balun package comprising multiple inductive cable baluns for magnetic resonance imaging (MRI).

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purposes of simplicity and clarity and does not in itself dictate a relationship between the various embodiments and/or configurations discussed.

Further, spatially relative terms, such as "beneath," "below," "lower," "above," "upper," "lower," and the like, may be used herein for ease of description to describe one element or feature's relationship to one or more other elements or features as illustrated in the figures. The spatially relative terms are intended to encompass different orientations of the device in use or operation in addition to the orientation depicted in the figures. The apparatus may be otherwise oriented (e.g., rotated 90 degrees or at other orientations), and the spatially relative descriptors used herein may likewise be interpreted accordingly.

A balun (also known as a cable trap) is used to block common mode current while allowing differential mode current (e.g., signal to flow). It is used in magnetic resonance imaging (MRI) radio frequency (RF) transmit (Tx) and receive (Rx) coils to block induced common mode current occurring at the MRI working frequency. Its function is important to the safety and performance of MRI coils. Because parts of MRI coils are close to the imaging area, it is important for the parts to be either non-magnetic or exhibit extremely low magnetism. Hence, a ferrite balun used in other industries cannot be used for MRI RF coils.

Inductor-capacitor (LC) resonance may be applied to generate enough common-mode blocking impedance at the MRI working frequency. There are several types of MRI RF coil baluns that use LC resonance to generate the common-mode blocking impedance. These balun types include a solenoid balun, an inductive balun, and a lattice balun.

A solenoid balun uses a coaxial cable bundle of one or more coaxial cables. The coaxial cable bundle comprises only one coaxial cable or otherwise comprises multiple coaxial cables with their shielding braids connected. The coaxial cable(s) are wound to create a solenoid, and a capacitor is soldered across the solenoid (e.g., to the shielding braids). The solenoid acts as an inductor to resonate in parallel with the capacitor at the MRI working frequency. The high impedance from the parallel resonance blocks the common mode current while allowing the signal to flow inside the coaxial cable(s) because the differential mode current does not generate any magnetic field outside the coaxial cable(s) to resonate with the capacitor. This kind of balun is strong but depends on soldering to the coaxial cable(s). Further, when the coaxial cable(s) become straight, the balun becomes a bazooka balun. A bazooka balun has weaker blocking strength due to the small inductance of straight coaxial cable(s).

An inductive balun is formed by winding a coaxial cable bundle of one or more coaxial cables around an LC resonant circuit. As above, the coaxial cable bundle comprises only one coaxial cable or otherwise comprises multiple coaxial cables. The winding can have a solenoid shape, a saddle-spiral shape, a toroid shape, or any other inductance generating shape. The LC resonant circuit has an inductance $L_1$ and a capacitance $C_1$ resonating together at an MRI working frequency, and further comprises a resistance $R_1$. The coaxial cable(s) have an inductance $L_2$ and a resistance $R_1$ at the winding.

Because $L_2$ is wound around the LC resonant circuit, there is a significant mutual inductance M between $L_1$ and $L_2$. M can be written as $k*\sqrt{L_1*L_2}$, where k is the coupling coefficient. Depending on the direction of the winding (e.g., counterclockwise or clockwise) and how strong it is wound (e.g., tightly or loosely), k ranges from $-1$ to $1$. So long as k, $L_1$, and $L_2$ are not small, the inductive balun is good at blocking common mode current. Additionally, in contrast with the solenoid balun, the inductive balun does not depend on soldering. The coaxial cable(s) are just wound around the LC resonant circuit.

A lattice balun comprises four lumped elements (e.g., two equal inductors and two equal capacitors). Lattice baluns are good at blocking common mode current but filter only one coaxial cable. Further, the lattice balun is not really a cable balun because it depends on both signal and ground lines of a coaxial cable being soldered to one side of the balun.

Any one of the foregoing MRI RF coil baluns depends on a set of one or more resonate circuits to block common mode current. Further, any one of the foregoing MRI RF coil baluns can only block one common mode current, not multiple common mode currents. Therefore, filtering multiple coaxial cable bundles cables having different common mode currents depends on multiple baluns, each with its own set of one or more resonant circuits. This may pose challenges for MRI RF coils having large numbers of channels.

Phased array Rx coils have become common for almost all MRI RF Rx coils. A phased array Rx coil has the benefit of a high signal-to-noise ratio (SNR) near the shallow imaging area (e.g., similar to a small coil), and also has the benefit of a high SNR in the deep imaging area (e.g., similar to a large coil). However, the number of Rx channels can be large, such as 64 channels or more. Further, parallel transmission (pTx) coils have become common for MRI RF Tx coils of MRI systems operating at high $B_0$ magnetic fields (e.g., at 7 Tesla (T) or above). Similar to phased array Rx coils, the number of Tx channels can be large in pTx coils.

Due to the prominence of phased array Rx coils and pTx coils, an MRI RF coil may have a large number of Tx and/or Rx channels (e.g., 32 channels or more). Further, the Tx and/or Rx channels are likely to have individual baluns before corresponding coaxial cables are bundled (e.g., at an all-cable bundle) inside the MRI RF coil and then connected to one or more external composite coil cable(s), which connect to an RF coil interface of an MRI system. For example, an MRI RF coil may have 32 channels and 32 baluns. The reason the Tx and/or Rx channel are likely to have individual baluns is to block all possible unwanted and potentially dangerous common mode current on each coaxial cable. This includes blocking common mode current from flowing from a channel to the all-cable bundle, as well as blocking attenuated common mode current from flowing from the neighboring channels to the channel. As to the latter, current may flow from channel to channel through the all-cable bundle.

Baluns take up space in an MRI RF coil, add additional weight to the MRI RF coil, depend on mechanical packages (e.g., covers, screws, etc.), and affect user experience. Further, the baluns may couple (e.g., inductively and resistively couple) to each other if grouped together for less mechanical packages. Such coupling may increase signal noise and/or allow common mode current to pass between the baluns. Therefore, having a large number of channels may lead to a large number of balun packages and may pose challenges.

The present disclosure is directed to a mechanical balun package for an MRI RF coil. The mechanical balun package comprises a plurality of inductive cable baluns sharing a set of resonant circuits, which allows a total number of balun mechanical packages in the MRI RF coil to be reduced. This frees up space, reduces weight, and improves user experience.

In some embodiments, a first inductive cable balun includes a first resonant circuit corresponding to a first cable bundle, and a second inductive cable balun includes a second resonant circuit corresponding to a second cable bundle. Further, a first decoupling circuit leg is between and shared by the first and second resonant circuits. Because the first and second resonant circuits share the first decoupling circuit leg, the first and second resonant circuits form a continuous circuit. As such, the first and second resonant circuits may be regarded as being part of the same set of resonant circuits. The first decoupling circuit leg includes one or more decoupling inductors and/or one or more decoupling capacitors and is configured to decouple the first and second resonant circuits from each other. For example, the first decoupling circuit leg may minimize or eliminate the effect of the inductive coupling by negating reactance induced in the first and second resonant circuits by the inductive coupling.

Because the first decoupling circuit leg circuit decouples the first and second resonant circuits, the first and second inductive cable baluns may be packaged together without compromising signal quality and without the risk of common mode current passing between cable bundles. This frees up space in the MRI RF coil, reduces a weight of the MRI RF coil, and improves a user experience when working with the MRI RF coil.

With reference to FIG. 1, a circuit diagram 100 of some embodiments of a balun package comprising multiple inductive cable baluns 102 for MRI is provided. The multiple inductive cable baluns 102 comprise a first inductive cable balun 102a and a second inductive cable balun 102b. The first inductive cable balun 102a comprises a first resonant circuit 104a and is configured to block a first common current $I_1$ along a first cable bundle 106a. The second inductive cable balun 102b comprises a second resonant circuit 104b and is configured to block a second common mode current $I_2$ along a second cable bundle 106b.

The first resonant circuit 104a comprises a first balun inductor $L_{b1}$, and the first cable bundle 106a comprises a first cable inductor $L_{c1}$ inductively coupled to the first balun inductor $L_{b1}$ by a first mutual inductance $M_1$. The second resonant circuit 104b comprises a second balun inductor $L_{b2}$, and the second cable bundle 106b comprises a second cable inductor $L_{c2}$, inductively coupled to the second balun inductor $L_{b2}$ by a second mutual inductance $M_2$.

A first decoupling circuit leg 108a is between and shared by the first and second resonant circuits 104a, 104b to decouple the first and second resonant circuits 104a, 104b from each other. More specifically, because the first and second balun inductors $L_{b1}$, $L_{b2}$ are close to each other, there is mutual inductance between the first and second balun inductors $L_{b1}$, $L_{b2}$. The first decoupling circuit leg 108a has an impedance that negates a reactance from the mutual inductance, thereby decoupling the first and second balun inductors $L_{b1}$, $L_{b2}$ from each other and minimizing or eliminating the effect of this mutual inductance. Absent decoupling, such mutual inductance may lead to current (e.g., common mode current) being induced in the first resonant circuit 104a by the second resonant circuit 104b and vice versa.

The first decoupling circuit leg 108a is or comprises a first decoupling capacitor Cal. However, depending on a sign of the mutual inductance between the first and second balun inductors $L_{b1}$, $L_{b2}$, the first decoupling circuit leg 108a may be or comprise one or more decoupling inductors and/or a one or more decoupling capacitors.

To better understand how the first decoupling circuit leg 108a works, note that the first and second balun inductors $L_{b1}$, $L_{b2}$ are equivalent to a T-circuit having a first impedance $Z_1$, a second impedance $Z_2$, and a third impedance $Z_3$ branching from a common node. This is because of the inductive coupling between the first and second balun inductors $L_{b1}$, $L_{b2}$. The T-circuit may replace the first and second balun inductors $L_{b1}$, $L_{b2}$ in an equivalent circuit of the first and second resonant circuits 104a, 104b. Particularly, the first and third impedances $Z_1$, $Z_3$ may replace the first balun inductor $L_{b1}$ and the second and third impedances $Z_2$, $Z_3$ may replace the second balun inductor $L_{b2}$. As such, the first and second resonant circuits 104a, 104b may share the third impedance $Z_3$ in the equivalent circuit. The third impedance $Z_3$ corresponds to a mutual inductance $M_{b1}$ between the first and second balun inductors $L_{b1}$, $L_{b2}$ and may be modeled as an inductor with an inductance equal to the mutual inductance $M_{b1}$. For example, the third impedance $Z_3$ may be $Z_3 = j\omega M_{b1}$, where $\omega$ is the MRI working frequency.

Because the third impedance $Z_3$ is shared between the first and second resonant circuits 104a, 104b, coupling between the first and second resonant circuits 104a, 104b may result unless reactance of the third impedance $Z_3$ is negated. The one or more decoupling inductors and/or the one or more decoupling capacitors of the first decoupling circuit leg 108a are selected so an impedance $Z_{d1}$ of the first decoupling circuit leg 108a negates the reactance of the third impedance $Z_3$. As a result, the third impedance $Z_3$ and the impedance $Z_{d1}$ of the first decoupling circuit leg 108a sum to a value with a reactance of zero or substantially zero (e.g., the value is only real and very small or is close to zero). This has the effect of decoupling the first and second resonant circuits 104a, 104b from each other. In some embodiments, a value of the first decoupling capacitor $C_{d1}$ is chosen as $$C_{d1} = \frac{1}{\omega^2 M_{b1}}$$

to negate the reactance of the third impedance $Z_3$.

In addition to the mutual inductance between the first and second balun inductors $L_{b1}$, $L_{b2}$, there may be a non-trivial mutual inductance between the first and second cable inductors $L_{c1}$, $L_{c2}$. However, current through the first and second cable bundles 106a, 106b is small respectively due to the first and second inductive cable baluns 102a, 102b creating high impedances that block current. Therefore, the mutual inductance between the first and second cable inductors $L_{c1}$, $L_{c2}$ has little effect on the first and second inductive cable baluns 102a, 102b and may be ignored.

Because the first decoupling circuit leg 108a decouples the first and second resonant circuits 104a, 104b, the first and second inductive cable baluns 102a, 102b operate independent of each other. As a result, the first and second inductive cable baluns 102a, 102b may not only be employed to block the first and second common mode currents $I_1$, $I_2$ from passing respectively along the first and second cable bundles 106a, 106b, but may also be employed to block the first and second common mode currents $I_1$, $I_2$ from passing between the first and second cable bundles, 106a, 106b. Further, because the first decoupling circuit leg 108a decouples the first and second resonant circuits 104a, 104b, the first and second inductive cable baluns 102a, 102b may be packaged together without interfering with each other. This frees up space in an MRI RF coil, reduces a weight of the MRI RF coil, and improves user experience.

With continued reference to FIG. 1, the first resonant circuit 104a further comprises a first balun capacitor $C_{b1}$ that resonates with the first balun inductor $L_{b1}$, and also with the first cable inductor $L_{c2}$ because of the first mutual inductance $M_1$. Such resonance is at a first working frequency (e.g., a Larmor frequency for hydrogen nuclei or the like) to create a high impedance that blocks common mode current $I_1$ at the first working frequency in the first cable bundle 106a. In some embodiments, resonance is achieved by selecting values of the first balun capacitor $C_{b1}$, the first balun inductor $L_{b1}$, and the first cable inductor $L_{c2}$ so reactance along a loop of the first resonant circuit 104a is zero at the first working frequency (e.g., impedances along the loop sum to a value with a reactance of zero).

The second resonant circuit 104b further comprises a second balun capacitor $C_{b2}$ that resonates with the second balun inductor $L_{b2}$, and also with the second cable inductor $L_{c2}$, because of the second mutual inductance $M_2$. Such resonance is at a second working frequency (e.g., a Larmor frequency for hydrogen nuclei or the like) to create a high impedance that blocks common mode current $I_2$ at the second working frequency in the second cable bundle 106b. In some embodiments, resonance is achieved by selecting values of the second balun capacitor $C_{b2}$, the second balun inductor $L_{b2}$, and the second cable inductor $L_{c2}$, so reactance along a loop of the second resonant circuit 104b is zero at the second working frequency (e.g., impedances along the loop sum to a value with a reactance of zero).

The first and second working frequencies may be the same or different and may be tuned independent of each other. Further, the first decoupling circuit leg 108a may be effectively ignored for the first and second resonant circuits 104a, 104b. As described above, a reactance of the first decoupling circuit leg 108a is negated by the mutual inductance between the first and second balun inductors $L_{b1}$, $L_{b2}$. Further yet, the first and second resonant circuits 104a, 104b may be analyzed using T-circuits similar to as described above due to the inductive coupling between the first balun inductor $L_{b1}$ and the first cable inductor $L_1$ and the inductive coupling between the second balun inductor $L_{b2}$ and the second cable inductor $L_2$.

To better understand a blocking strength of the first inductive cable balun 102a, consider that the high blocking impedance $Z_{block}$ of the first inductive cable balun 102a may be written as follows in Eq. 1.

$$Z_{block} = j\omega L_{c1} + R_{c1} + \frac{(\omega M_1)^2}{R_{b1} + \left(j\omega L_{b1} - \frac{j}{\omega C_{b1}}\right)} \quad \text{Eq. 1}$$

Within Eq. 1, ω is the angular working frequency, $L_{c1}$ is the first cable inductor, $R_{c1}$ is a resistance (not shown) of the first cable bundle 106a, $R_{b1}$ is a resistance (not shown) of the first resonant circuit 104a, $L_{b1}$ is the first balun inductor, $C_{b1}$ is the first balun capacitor, and $M_1$ is the first mutual inductance between $L_{c1}$ and $L_{b1}$.

Supposing an inductor $Q_{b1}$ is defined as $\omega L_{b1}/R_{b1}$, and an inductor $Q_{c1}$ is defined as $\omega L_{c1}/R_{c1}$, at a resonant frequency of $$\omega L_{b1} = \frac{1}{\omega C_{b1}},$$

Eq. 1 may DC rewritten as follows in Eq. 2.

$$Z_{block} = \omega L_{c1}\left(j + \frac{1}{Q_{c1}} + |k| * Q_{b1}\right) \quad \text{Eq. 2}$$

Within Eq. 2, k is the coupling coefficient between $L_{c1}$ and $L_{b1}$. Further, if $Q_{b1}$, $Q_{c1}$, k, and $L_{c1}$ are large, then Eq. 2 may be rewritten as follows in Eq. 3.

$$Z_{block} = j\omega L_{c1} + \omega M_1 \sqrt{\frac{L_{c1}}{L_{b1}}} * Q_{b1}, \quad \text{Eq. 3}$$

Thus, the first inductive cable balun 102a may provide a large blocking impedance so long as k, $Q_{b1}$, $Q_{c1}$, and $L_{c1}$ are large. A large $Q_{b1}$, $Q_{c1}$, and $L_{c1}$ may be achieved by winding cable (e.g., the first and second cable bundles 106a, 106b) with multiple turns on a large inductor former. A large k may be achieved by winding $L_{c1}$ and $L_{b1}$ closely to each other. Further, while the foregoing analysis for assessing blocking strength was applied to the first inductive cable balun 102a, the same analysis is equally applicable to the second inductive cable balun 102b.

The first and second cable bundles 106a, 106b correspond to coaxial cables. For example, the first and second cable bundles 106a, 106b may each be or comprise one or more coaxial cables. To the extent that a cable bundle has only one coaxial cable, the cable bundle may also be referred to as a coaxial cable. The first and second inductive cable baluns 102a, 102b block common mode current on shielding braids of the coaxial cables. On the other hand, differential mode current on central conductors of the coaxial cables is too small for resonance with the first and second resonant circuits 104a, 104b, whereby there is no blocking. In contrast with a solenoid balun, there is no soldering between the coaxial cables of a cable bundle (e.g., soldering of shielding braids together) and there is no soldering between the cable bundles and the first and second resonant circuits 104a, 104b.

In some embodiments, the first and second resonant circuits 104a, 104b may be regarded as resonant loops and/or may be regarded as parallel LC circuits.

In some embodiments, the first and second balun inductors $L_{b1}$, $L_{b2}$ are the same (e.g., in terms of inductance or the like). In these embodiments, the first and second cable inductors $L_{c1}$, $L_{c2}$ may, for example, be the same or different (e.g., in terms of inductance or the like). In other embodiments, the first and second balun inductors $L_{b1}$, $L_{b2}$ are different (e.g., in terms of inductance or the like). In these embodiments, the first and second cable inductors $L_{c1}$, $L_{c2}$ may, for example, be the same or different (e.g., in terms of inductance or the like).

In some embodiments, the first and second cable inductors $L_{c1}$, $L_{c2}$ are formed by windings respectively of the first and second cable bundles 106a, 106b. The windings may, for example, be solenoid shaped, saddle shaped, toroid shaped, spiral shaped, or some other shape to generate a suitable amount of inductance. In some embodiments, the first and second balun inductors $L_{b1}$, $L_{b2}$ are formed by windings of conductive cable. The windings may, for example, be solenoid shaped, saddle shaped, toroid shaped, spiral shaped, or some other shape to generate a suitable amount of inductance. In some embodiments, the first cable bundle 106a winds around the first balun inductor $L_{b1}$, but not the second balun inductor $L_{b2}$, and the second cable bundle 106b winds around the second balun inductor $L_{b2}$, but not the first balun inductor $L_{b1}$.

Figure 2A:
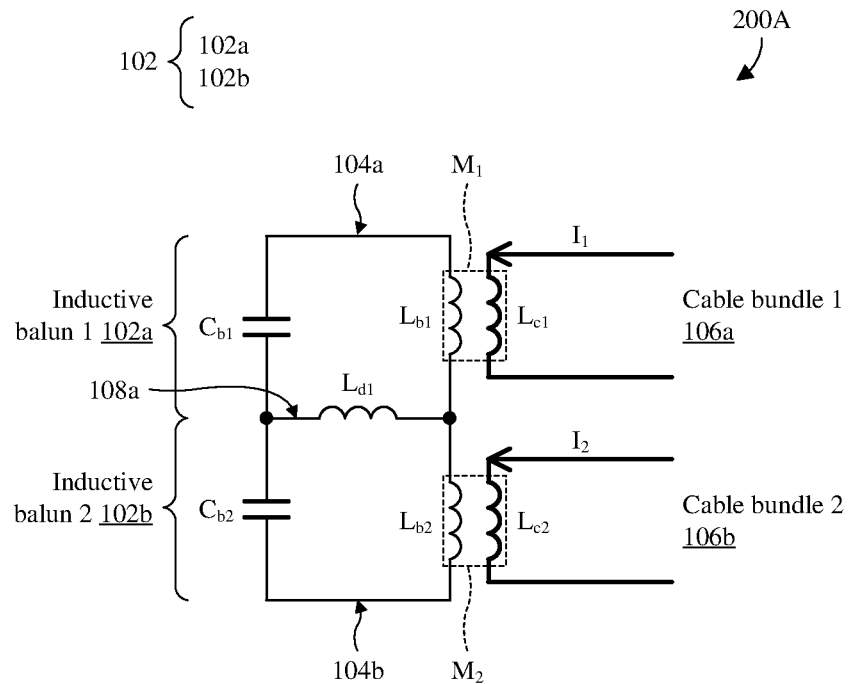
FIGS. 2A and 2B illustrate circuit diagrams of some alternative embodiments of the balun package of FIG. 1 in which a decoupling circuit leg is varied.
Figure 2B:
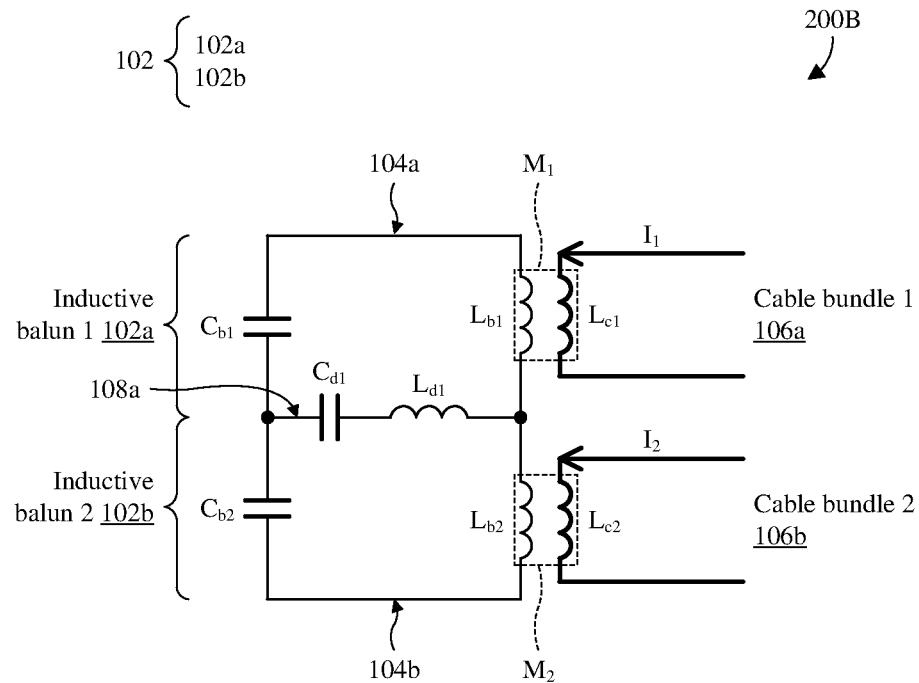

With reference to FIGS. 2A and 2B, circuit diagrams 200A, 200B of some alternative embodiments of the balun package of FIG. 1 are provided in which the first decoupling circuit leg 108a is varied. As above, the first decoupling circuit leg 108a has an impedance that negates the mutual inductance between the first and second balun inductors $L_{b1}$, $L_{b2}$, whereby the first decoupling circuit leg 108a is varied depending on the mutual inductance.

In FIG. 2A, the first decoupling circuit leg 108a is or comprises a first decoupling inductor $L_{d1}$ instead of the first decoupling capacitor $C_{d1}$. As a result, the mutual inductance between the first and second balun inductors $L_{b1}$, $L_{b2}$ has an opposite sign as in FIG. 1. For example, the mutual inductance may have a positive sign in FIG. 1 and a negative sign in FIG. 2A.

In FIG. 2B, the first decoupling circuit leg 108a comprises both the first decoupling inductor $L_{d1}$ and the first decoupling capacitor $C_{d1}$.

While FIGS. 1, 2A, and 2B illustrate the first decoupling circuit leg 108a as comprising one decoupling capacitor $C_{d1}$ and/or one decoupling inductor $L_{d1}$, the first decoupling circuit leg 108a may more generally comprise one or more decoupling capacitors and/or one or more decoupling inductors. More decoupling elements provide additional degrees of freedom for tuning an impedance of the first decoupling circuit leg 108a to negate mutual inductance between the first balun inductor $L_{b1}$ and the second inductor balun $L_{b2}$.

Figure 3:
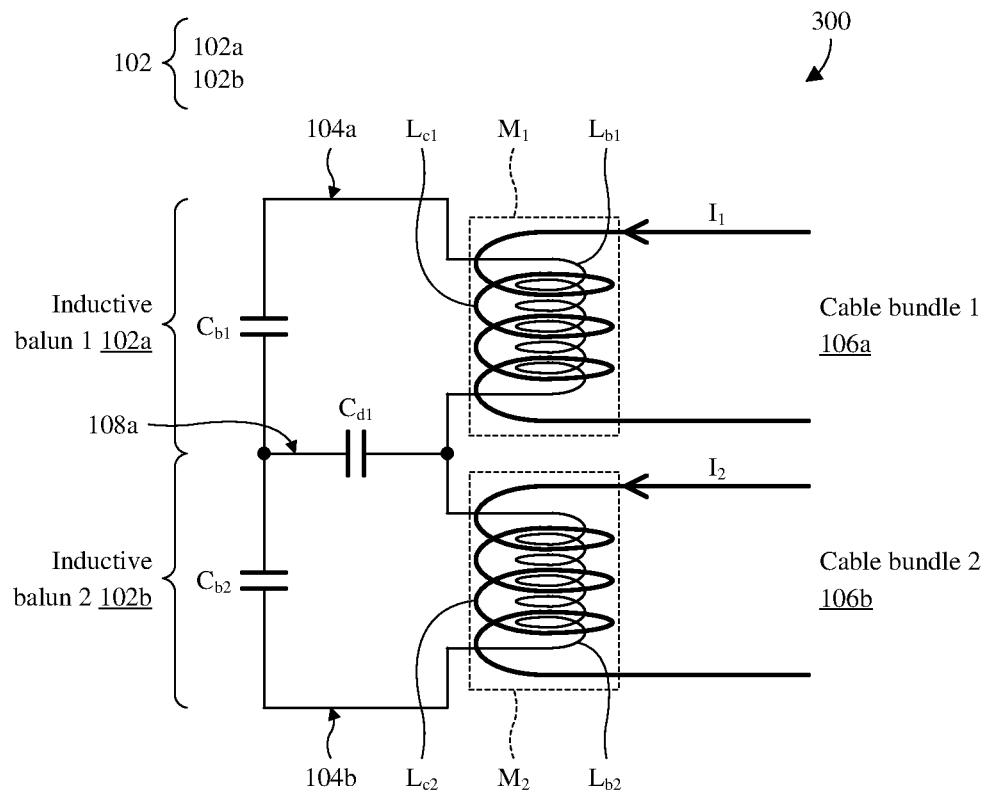
FIG. 3 illustrates a schematic diagram of some embodiments of the balun package of FIG. 1 in which cable bundles are wound to form solenoid-shaped inductors.

With reference to FIG. 3, a schematic diagram 300 of some embodiments of the balun package of FIG. 1 is provided in which the first and second cable inductors $L_{c1}$, $L_{c2}$, and the first and second balun inductors $L_{b1}$, $L_{b2}$ are solenoid shaped. Saddle-spiral shapes, toroid shapes, and other suitable shapes are amenable in alternative embodiments.

The first balun inductor $L_{b1}$ is formed from cable or wire wound in a first solenoid shape, and the first cable inductor $L_{c1}$ is formed from a portion of the first cable bundle 106a that is wound around the first balun inductor $L_{b1}$ in a second solenoid shape. Further, the first and second solenoid shapes are coaxial. This, in turn, allows strong inductive coupling between the first balun inductor $L_{b1}$ and the first cable inductor $L_{c1}$, whereby the first mutual inductance $M_1$ is large. The second balun inductor $L_{b2}$ is formed from cable or wire wound in a third solenoid shape, and the second cable inductor $L_{c2}$, is formed from a portion of the second cable bundle 106b that is wound around the second balun inductor $L_{b2}$ in a fourth solenoid shape. Further, the third and fourth solenoid shapes are coaxial. This, in turn, allows strong inductive coupling between the second balun inductor $L_{b2}$ and the second cable inductor $L_{c2}$, whereby the second mutual inductance $M_2$ is large.

Figure 4:
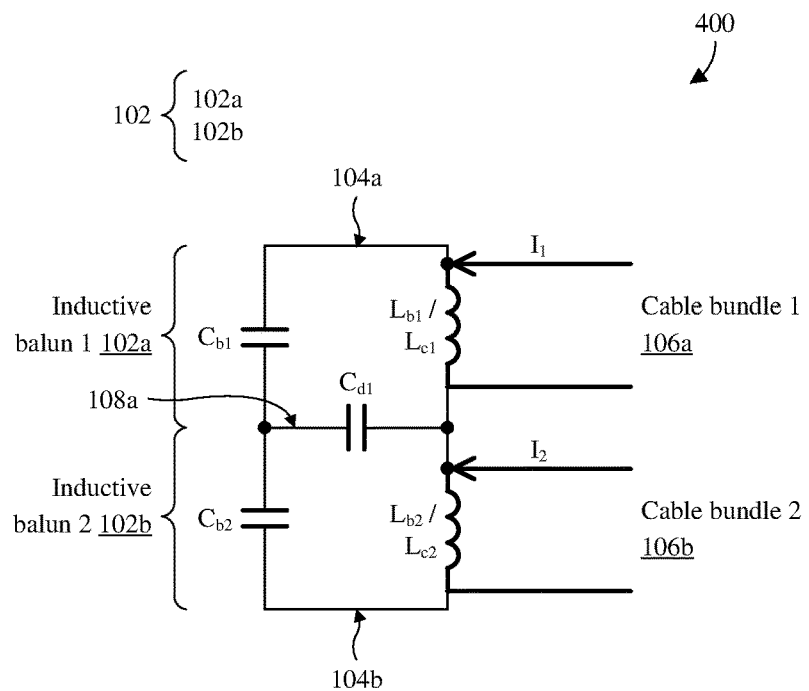
FIG. 4 illustrates a circuit diagram of some alternative embodiments of the balun package of FIG. 1 in which cable bundles form balun inductors.

With reference to FIG. 4, a circuit diagram 400 of some alternative embodiments of the balun package of FIG. 1 is provided in which the first and second cable bundles 106a, 106b form the first and second balun inductors $L_{b1}$, $L_{b2}$. As a result, the first balun inductor $L_{b1}$ and the first cable inductor $L_{c1}$ are the same, and a remainder of the first resonant circuit 104a (e.g., the first decoupling circuit leg 108a and the first balun capacitor $C_{b1}$) is soldered across the first balun inductor $L_{b1}$ to shielding braid(s) of the first cable bundle 106a. Further, the second balun inductor $L_{b2}$ and the second cable inductor $L_{c2}$, are the same, and a remainder of the second resonant circuit 104b (e.g., the first decoupling circuit leg 108a and the second balun capacitor $C_{b2}$) is soldered across the second balun inductor $L_{b2}$ to a shielding braid(s) of second cable bundle 106b.

Because the first and second cable bundles 106a, 106b form the first and second balun inductors $L_{b1}$, $L_{b2}$, there are three virtual grounds. The first decoupling circuit leg 108a forces neighboring ends of the first and second cable bundles 106a, 106b to the same virtual ground. This is to be contrasted with FIG. 1, which has four virtual grounds.

Figure 5:
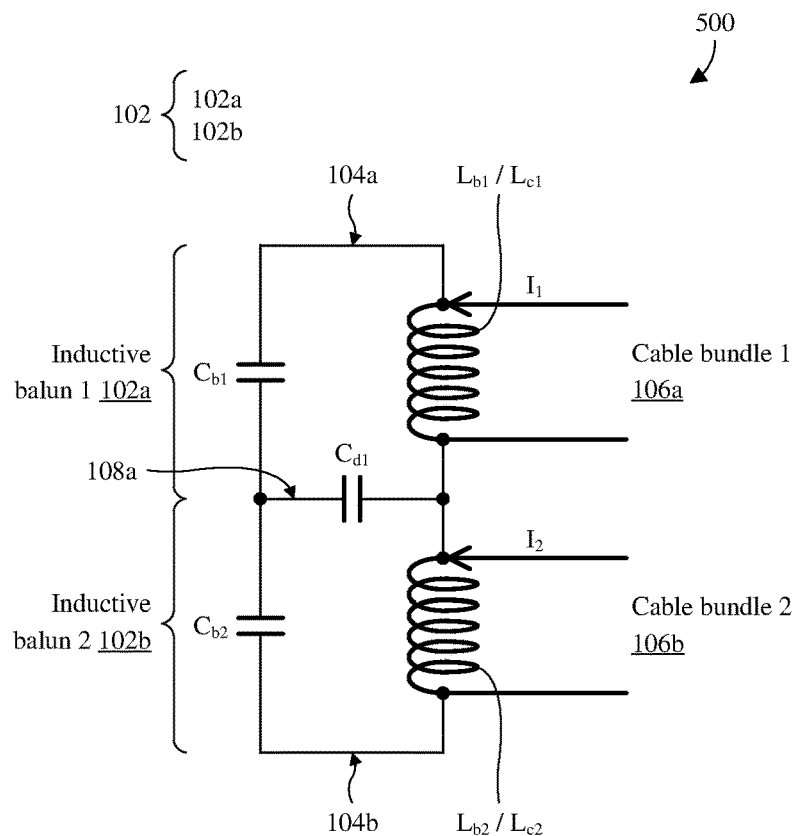
FIG. 5 illustrates a schematic diagram of some embodiments of the balun package of FIG. 4 in which the cable bundles are wound to form the balun inductors as solenoids.

With reference to FIG. 5, a schematic diagram 500 of some embodiments of the balun package of FIG. 4 is provided in which the first and second cable bundles 106a, 106b are wound to form the first and second balun inductors $L_{b1}$, $L_{b2}$ as solenoids. Saddle-spiral shapes, toroid shapes, and other suitable shapes are amenable in alternative embodiments.

Figure 6:
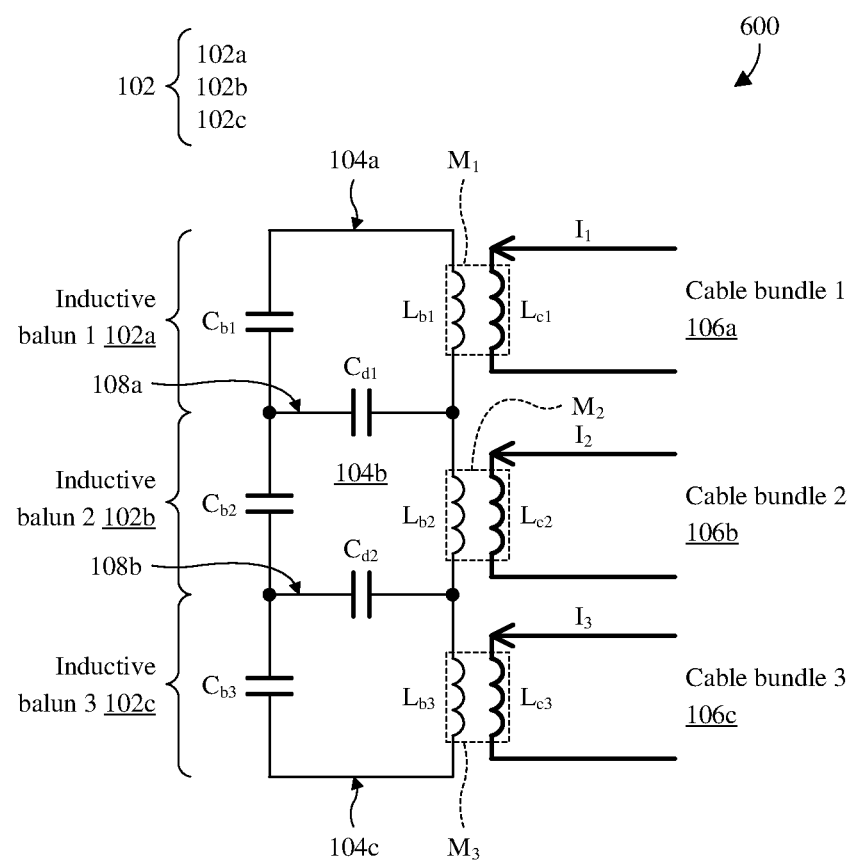
FIG. 6 illustrates a circuit diagram of some alternative embodiments of the balun package of FIG. 1 in which the balun package comprises an additional inductive cable balun.

With reference to FIG. 6, a circuit diagram 600 of some alternative embodiments of the balun package of FIG. 1 is provided in which the balun package comprises a third inductive cable balun 102c. Similar to the first and second inductive cable baluns 102a, 102b, the third inductive cable balun 102c comprises a third resonant circuit 104c and is configured to block a third common mode current $I_3$ along a third cable bundle 106c. The third resonant circuit 104c comprises a third balun inductor $L_{b3}$, and the third cable bundle 106c comprises a third cable inductor $L_{c3}$ inductively coupled to the third balun inductor $L_{b3}$ by a third mutual inductance $M_3$.

A second decoupling circuit leg 108b is between and shared by the second and third resonant circuits 104b, 104c to decouple the second and third resonant circuits 104b, 104c from each other. More specifically, because the second and third balun inductors $L_{b2}$, $L_{b3}$ are close to each other, there is mutual inductance between the second and third balun inductors $L_{b2}$, $L_{b3}$. The second decoupling circuit leg 108b has an impedance that negates a reactance from the mutual inductance, thereby decoupling the second and third balun inductors $L_{b2}$, $L_{b3}$ from each other and minimizing or eliminating the effect of this mutual inductance. Absent decoupling, such mutual inductance may lead to current (e.g., common mode current) being induced in the second resonant circuit 104b by the third resonant circuit 104c and vice versa.

The second decoupling circuit leg 108b is or comprises a second decoupling capacitor $C_{d2}$. However, depending on a sign of the mutual inductance between the second and third balun inductors $L_{b2}$, $L_{b3}$, the second decoupling circuit leg 108b may be or comprise one or more decoupling inductors and/or a one or more decoupling capacitor. Further, the second decoupling circuit leg 108b may operate in the same manner as described above for the first decoupling circuit leg 108a. In some embodiments, a value of the second decoupling capacitor $C_{d2}$ is chosen as $$C_{d2} = \frac{1}{\omega^2 M_{b2}}$$

to negate the reactance from the mutual inductance between the second and third balun inductors $L_{b2}$, $L_{b3}$. $\omega$ is the MRI working frequency, and $M_{b2}$ is the mutual inductance.

In addition to the mutual inductance between the first and second balun inductors $L_{b1}$, $L_{b2}$, there may be a non-trivial mutual inductance between the second and third cable inductors $L_{c2}$, $L_{c3}$. However, current through the second and third cable bundles 106b, 106c is small due to the second and third inductive cable baluns 102b, 102c creating high impedances that block current. Therefore, the mutual inductance between the second and third cable inductors $L_{c2}$, $L_{c3}$ has little effect on the second and third inductive cable baluns 102b, 102c and may be ignored.

Further, there may be mutual inductance between the first and third balun inductors $L_{b1}$, $L_{b3}$ and between the first and third cable inductors $L_{c1}$, $L_{c3}$. However, the mutual inductance is assumed to be small due to the relatively large spacing between inductor pairs. Hence, the mutual inductance may be ignored. If the mutual inductance between the first and third cable inductors $L_{c1}$, $L_{c3}$ is large, the mutual inductance may still be ignored. Current through the first and third cable bundles 106a, 106c is small respectively due to the first and third inductive cable baluns 102a, 102c. Therefore, the mutual inductance between the first and third cable inductors $L_{c1}$, $L_{c3}$ has little effect on the first and third inductive cable baluns 102a, 102c and may be ignored.

If the mutual inductance between the first and third balun inductors $L_{b1}$, $L_{b3}$ is large, a third decoupling circuit leg may be employed. The third decoupling circuit leg is between and shared by the first and third resonant circuits 104a, 104c to decouple the first and third resonant circuits 104a, 104c from each other. The third decoupling circuit leg has an impedance that negates a reactance from the mutual inductance, thereby decoupling the first and third balun inductors $L_{b1}$, $L_{b3}$ from each other and minimizing or eliminating the effect of this mutual inductance. Similar to the second decoupling circuit leg 108b, the third decoupling circuit leg is or comprises one or more decoupling inductors and/or a one or more decoupling capacitors.

Because of the decoupling, the multiple inductive cable baluns 102 operate independent of each other. As a result, the multiple inductive cable baluns 102 may not only be employed to block the first, second, and third common mode currents $I_1$, $I_2$, $I_3$ from passing respectively along the first, second, and third cable bundles 106a-106c, but may also be employed to block the first, second, and third common mode currents $I_1$, $I_2$, $I_3$ from passing between the first, second, and third cable bundles 106a-106c. Further, the multiple inductive cable baluns 102 may be packaged together without interfering with each other. This frees up space in an MRI RF coil, reduces a weight of the MRI RF coil, and improves user experience.

With continued reference to FIG. 6, the third resonant circuit 104c further comprises a third balun capacitor $C_{b3}$ that resonates with the third balun inductor $L_{b3}$, and also with the third cable inductor $L_{c3}$ because of the third mutual inductance $M_3$. Such resonance is at a third working frequency (e.g., a Larmor frequency for hydrogen nuclei or the like) to create a high impedance that blocks common mode current at the third working frequency in the third cable bundle 106c. In some embodiments, resonance is achieved by selecting values of the third balun capacitor $C_{b3}$, the third balun capacitor $C_{b3}$, and the third cable inductor $L_{c3}$ so reactance along a loop of the third resonant circuit 104c is zero at the third working frequency (e.g., impedances along the loop sum to a value with a reactance of zero).

The first, second, and third working frequencies may be the same or different and may be tuned independent of each other. Further, the first and second decoupling circuit legs 108a, 108b may be effectively ignored for the first, second, and third resonate circuits 104a-104c. The first decoupling circuit leg 108a may be ignored because, as described above, it is negated by the mutual inductance between the first and second balun inductors $L_{b1}$, $L_{b2}$. The second decoupling circuit leg 108b may be ignored because, as described above, it is negated by the mutual inductance between the second and third balun inductors $L_{b2}$, $L_{b3}$.

The first, second, and third cable bundles 106a-106c correspond to coaxial cables. For example, the first, second, and third cable bundles 106a-106c may each be or comprise one or more coaxial cables. To the extent that a cable bundle has only one coaxial cable, the cable bundle may also be referred to as a coaxial cable. The first, second, and third cable bundles 106a-106c block common mode current on outer shielding braids of the coaxial cables. On the other hand, current on central conductors of the coaxial cables is too small for resonance with the first, second, and third resonant circuits 104a-104c, whereby there is no blocking.

In some embodiments, the first, second, and third resonant circuits 104a-104c may be regarded as resonant loops and/or may be regarded as parallel LC circuits.

In some embodiments, the second and third balun inductors $L_{b2}$, $L_{b3}$ are the same (e.g., in terms of inductance or the like). In these embodiments, the second and third cable inductors $L_{c1}$, $L_{c3}$ may, for example, be the same or different (e.g., in terms of inductance or the like). In other embodiments, the second and third balun inductors $L_{b2}$, $L_{b3}$ are different (e.g., in terms of inductance or the like). In these embodiments, the second and third cable inductors $L_{c1}$, $L_{c3}$ may, for example, be the same or different (e.g., in terms of inductance or the like).

In some embodiments, the second and third cable inductors $L_{c1}$, $L_{c3}$ are formed by windings respectively of the second and third cable bundles 106b, 106c. The windings may, for example, be solenoid shaped, saddle shaped, toroid shaped, spiral shaped, or some other shape to generate a suitable amount of inductance. In some embodiments, the second and third balun inductors $L_{b2}$, $L_{b3}$ are formed by windings of conductive cable. The windings may, for example, be solenoid shaped, saddle shaped, toroid shaped, spiral shaped, or some other shape to generate a suitable amount of inductance. In some embodiments, the second cable bundle 106b winds around the second balun inductor $L_{b2}$, but not the third balun inductor $L_{b3}$, and the third cable bundle 106c winds around the third balun inductor $L_{b3}$, but not the second balun inductor $L_{b2}$.

Figure 7:
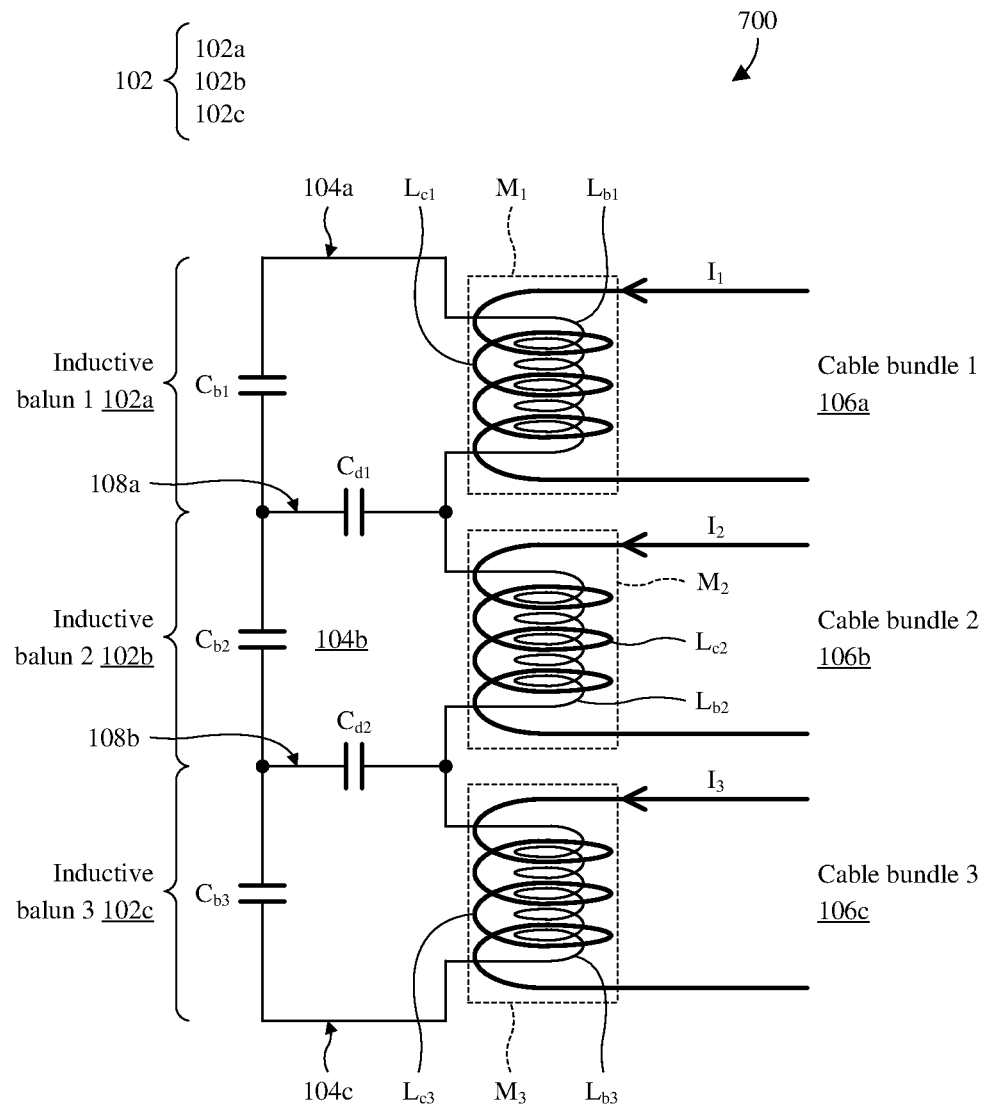
FIG. 7 illustrates a schematic diagram of some embodiments of the balun package of FIG. 6 in which cable bundles are wound to form solenoid-shaped inductors.

With reference to FIG. 7, a schematic diagram 700 of some embodiments of the balun package of FIG. 6 is provided in which the first, second, and third cable inductors $L_{c1}$, $L_{c1}$, $L_{c3}$ and the first, second, and third balun inductors $L_{b1}$, $L_{b2}$, $L_{b3}$ are solenoid shaped. Saddle-spiral shapes, toroid shapes, and other suitable shapes are amenable in alternative embodiments.

The first and second balun inductors $L_{b1}$, $L_{b2}$ and the first and second cable inductors $L_{c1}$, $L_{c1}$, are as described with regard to FIG. 3, and the third balun inductor $L_{b3}$ and the third cable inductor $L_{c3}$ are similar to the first and second balun inductors $L_{b1}$, $L_{b2}$ and the first and second cable inductors $L_{c1}$, $L_{c2}$. The third balun inductor $L_{b3}$ is formed from cable or wire wound in a solenoid shape, and the third cable inductor $L_{c3}$ is formed from a portion of the third cable bundle 106c that is wound around the third balun inductor $L_{b3}$ in a solenoid shape. Further, the solenoid shapes are coaxial. As a result, the third balun inductor $L_{b3}$ and the third cable inductor $L_{c3}$ inductively couple strongly to each other and the third mutual inductance $M_3$ is large.

While FIGS. 6 and 7 are illustrated with three inductive cable baluns, it is to be appreciated that one or more additional inductive cable baluns are amenable. Each additional inductive cable balun is as the first, second, and third inductive cable baluns 102a-102c are described. Further, each neighboring pair of inductive cable baluns share a decoupling circuit leg, which is as the first and second decoupling circuit legs 108a, 108b are described.

Figure 8:
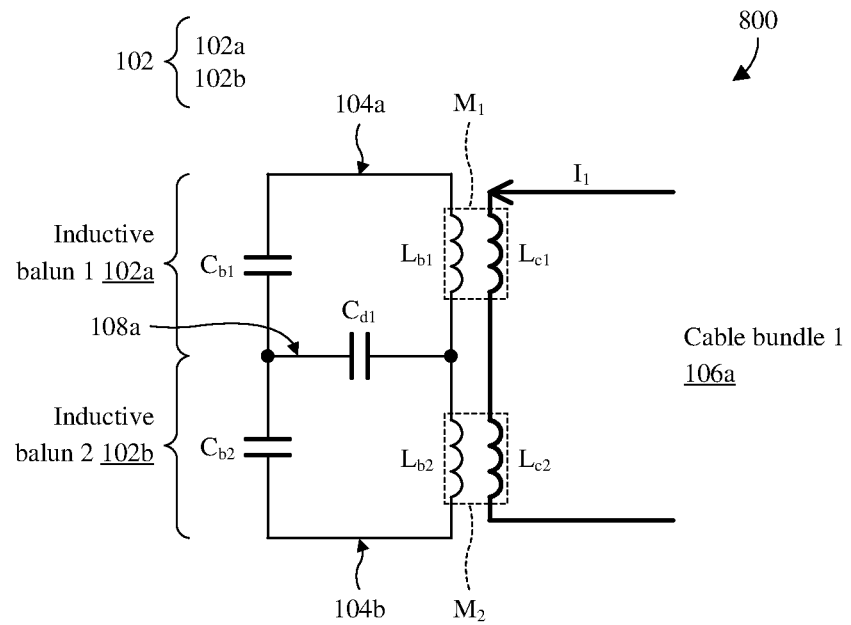
FIG. 8 illustrates a circuit diagram of some alternative embodiments of the balun package of FIG. 1 in which a single cable bundle is shared by the inductive cable baluns.

With reference to FIG. 8, a circuit diagram 800 of some alternative embodiments of the balun package of FIG. 1 is provided in which the first cable bundle 106a is shared by the first and second inductive cable baluns 102a, 102b and in which the second cable bundle 106b is omitted. Further, the first and second resonant circuits 104a, 104b are tuned to different working frequencies for a multi-tune MRI RF coil. The different working frequencies may, for example, correspond to Larmor frequencies for different nuclei (e.g., proton, fluorine, etc.).

By tuning the first and second resonant circuits 104a, 104b to different frequencies (e.g., $f_1$ and $f_2$), common mode current at the two different frequencies may be blocked. Further, where the different frequencies are far apart from each other, the first decoupling circuit leg 108a has less importance to tuning the different frequencies. However, if the different frequencies are close to each other (e.g., proton and fluorine frequencies), the first decoupling circuit leg 108a becomes important for tuning the different frequencies.

Absent the first decoupling circuit leg 108a, each cable bundle in the multi-tune MRI RF coil may have a balun for each working frequency, which increases the number of baluns. Decoupling the first and second inductive cable baluns 102a, 102b allows the first and second inductive cable baluns 102a, 102b to be packaged together. This may alleviate the large increase in balun packages that would otherwise occur.

Figure 9:
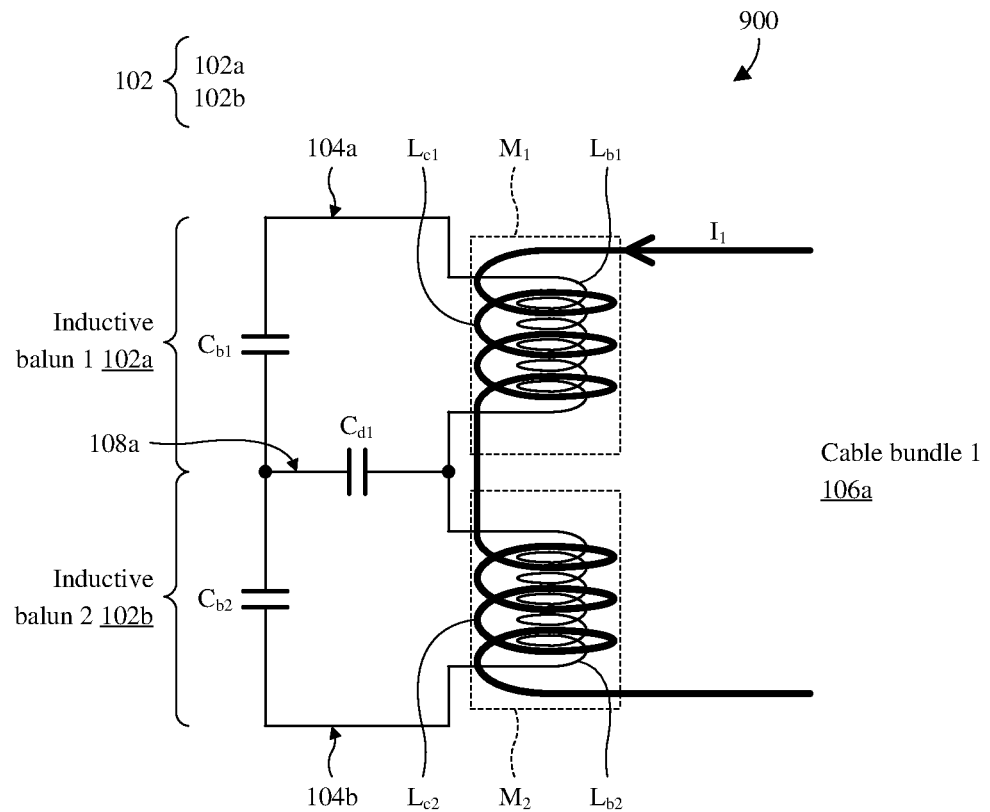
FIG. 9 illustrates a schematic diagram of some embodiments of the balun package of FIG. 8 in which the cable bundle is wound to form solenoid-shaped inductors.

With reference to FIG. 9, a schematic diagram 900 of some embodiments of the balun package of FIG. 8 is provided in which the first and second cable inductors $L_{c1}$, $L_{c1}$, and the first and second balun inductors $L_{b1}$, $L_{b2}$ are solenoid shaped as in FIG. 3. Saddle-spiral shapes, toroid shapes, and other suitable shapes are amenable in alternative embodiments. In contrast with FIG. 3, the second cable inductor $L_{c2}$, is formed from a portion of the first cable bundle 106a.

Figure 10:
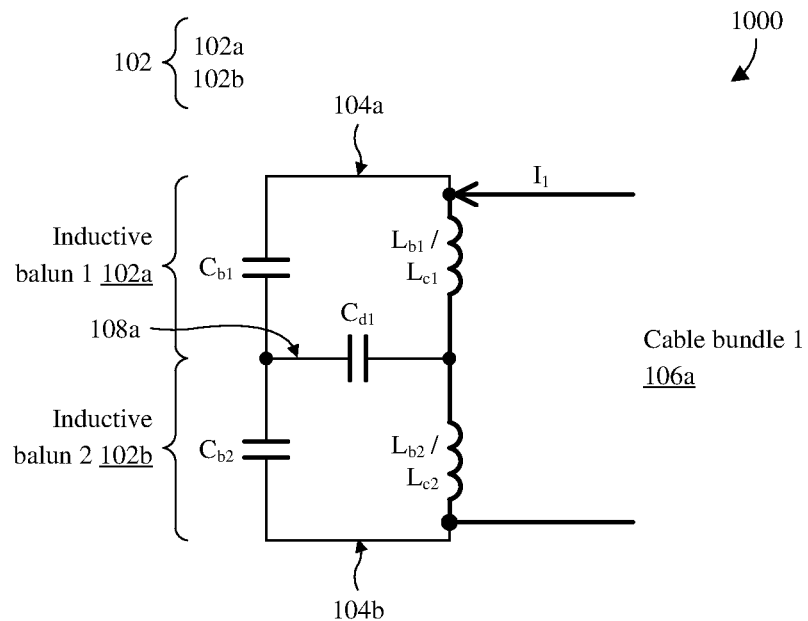
FIG. 10 illustrates a circuit diagram of some alternative embodiments of the balun package of FIG. 8 in which the cable bundle forms balun inductors.
Figure 11:
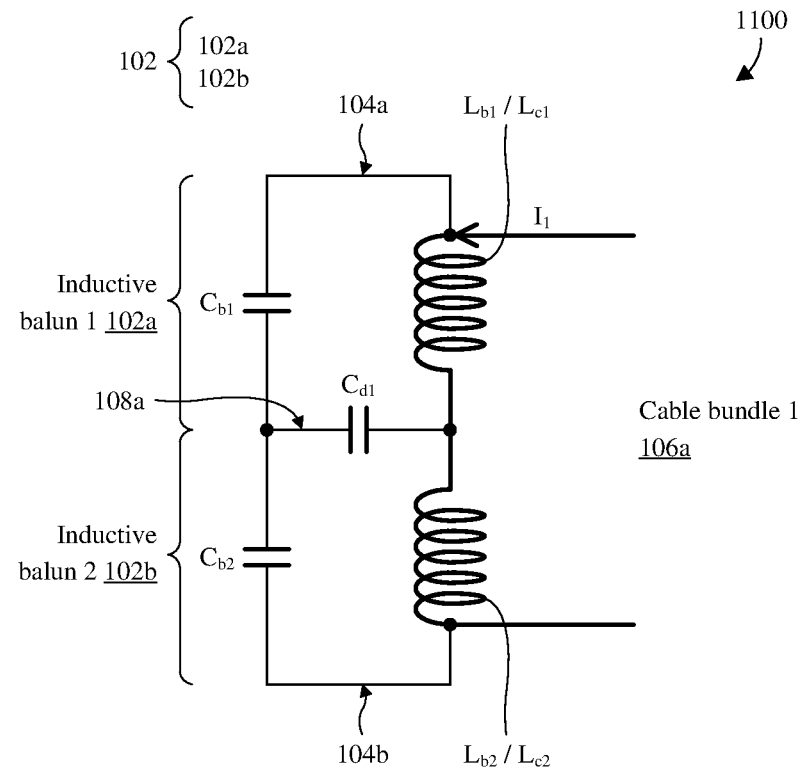
FIG. 11 illustrates a schematic diagram of some embodiments of the balun package of FIG. 10 in which the cable bundle is wound to form the balun inductors as solenoids.

While FIGS. 8 and 9 describe a multi-tune modification to the balun packages of FIGS. 1 and 3, respectively, it is to be appreciated that the multi-tune modification may be applied to any of the balun packages of FIGS. 2A, 2B, and 4-7. For example, FIG. 10 illustrates a circuit diagram 1000 of some alternative embodiments of the balun package of FIG. 8 in which the multi-tune modification is applied to the balun package of FIG. 4 instead of the balun package of FIG. 1. As another example, FIG. 11 illustrates a circuit diagram 1100 of some alternative embodiments of the balun package of FIG. 9 in which the multi-tune modification is applied to the balun package of FIG. 5 instead of the balun package of FIG. 3.

Figure 12:
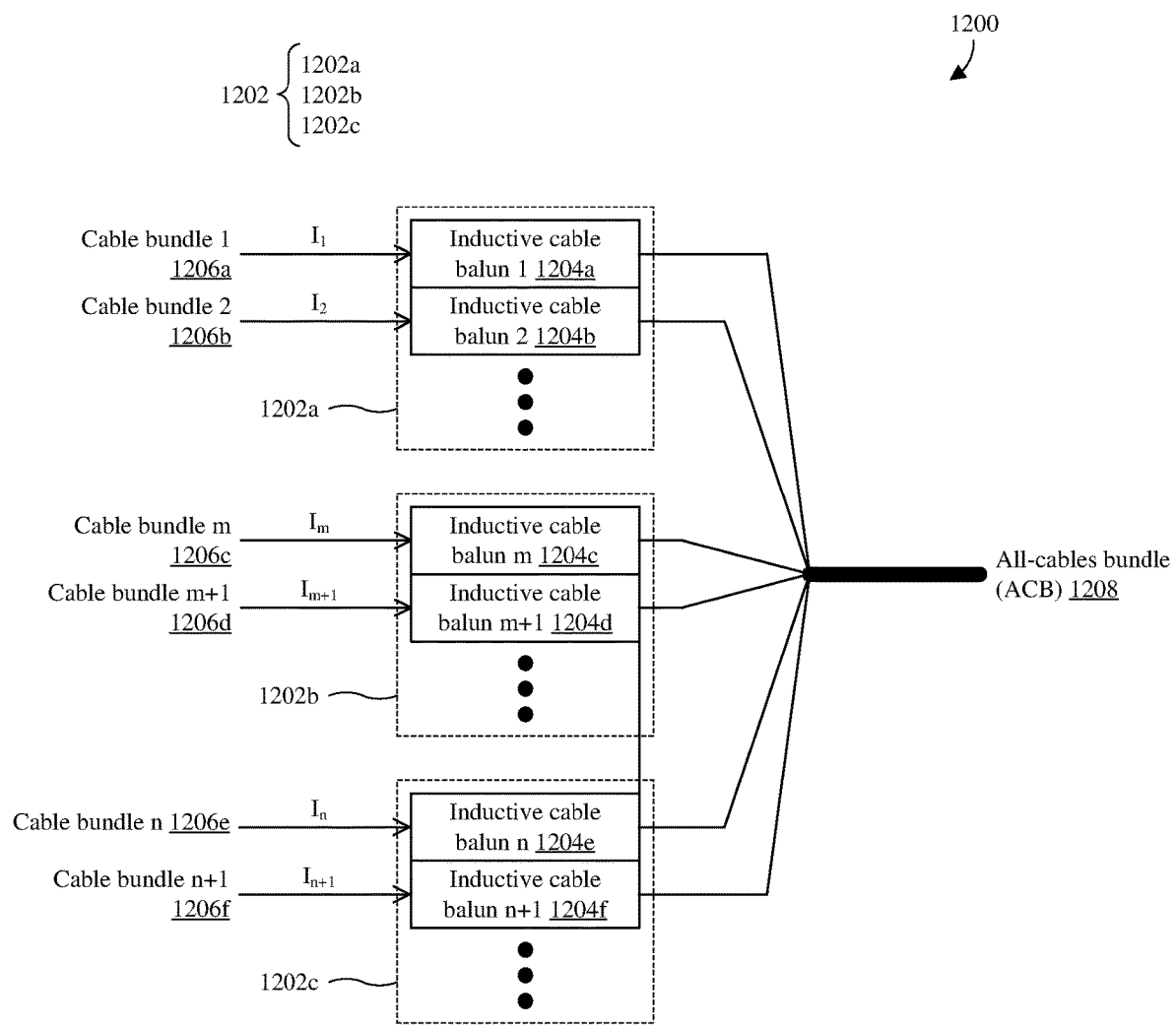
FIG. 12 illustrates a schematic diagram of some embodiments of multiple balun packages according to aspects of the present disclosure.

With reference to FIG. 12, a schematic diagram 1200 of some embodiments of multiple balun packages 1202 according to aspects of the present disclosure is provided. The multiple balun packages 1202 are representative of the balun packages that may be found within an MRI RF coil. Further, each of the multiple balun packages 1202 comprises two or more inductive cable baluns packaged together and decoupled (e.g., by decoupling circuit legs) as described above. For example, each of the multiple balun packages 1202 may, for example, be as in any of FIGS. 1, 2A, 2B, and 3-11. By including multiple inductive cable baluns per balun package, a total number of balun packages may be reduced compared. This may free up space in an MRI RF coil, reduce weight of the MRI RF coil, and improve user experience.

The multiple balun packages 1202 comprise a first balun package 1202a, a second balun package 1202b, and a third balun package 1202c. More or less balun packages are, however, amenable in alternative embodiments. The first balun package 1202a comprises a first inductive cable balun 1204a and a second inductive cable balun 1204b corresponding to a first cable bundle 1206a and a second cable bundle 1206b along which a first common mode current $I_1$ and a second common mode current $I_2$ flow. The second balun package 1202b comprises an mth inductive cable balun 1204c and an m+1th inductive cable balun 1204d corresponding to a mth cable bundle 1206c and an m+1th cable bundle 1206d along which an mth common mode current $I_m$ and an m+1th common mode current $I_{m+1}$ flow. The third balun package 1202c comprises an nth inductive cable balun 1204e and an n+1th inductive cable balun 1204f corresponding to a nth cable bundle 1206e and a n+1th cable bundle 1206f along which an nth common mode current $I_n$ and a n+1th common mode current $I_{n+1}$ flow. Note that each of the ellipses respectively at the multiple balun packages 1202 represent zero or more inductive cable baluns. Further, n and m represent integers corresponding to indexes.

The multiple balun packages 1202 block the common currents (e.g., $I_1$, $I_2$, $I_m$, etc.) along corresponding cable bundles (e.g., 1206a, 1206b, 1206c, etc.), which are then bundled into an all-cables bundle (ACB) 1208. The ACB 1208 may, for example, be connected to one or more external composite coil cables, which connect to an RF coil interface of an MRI system.

Figure 13:
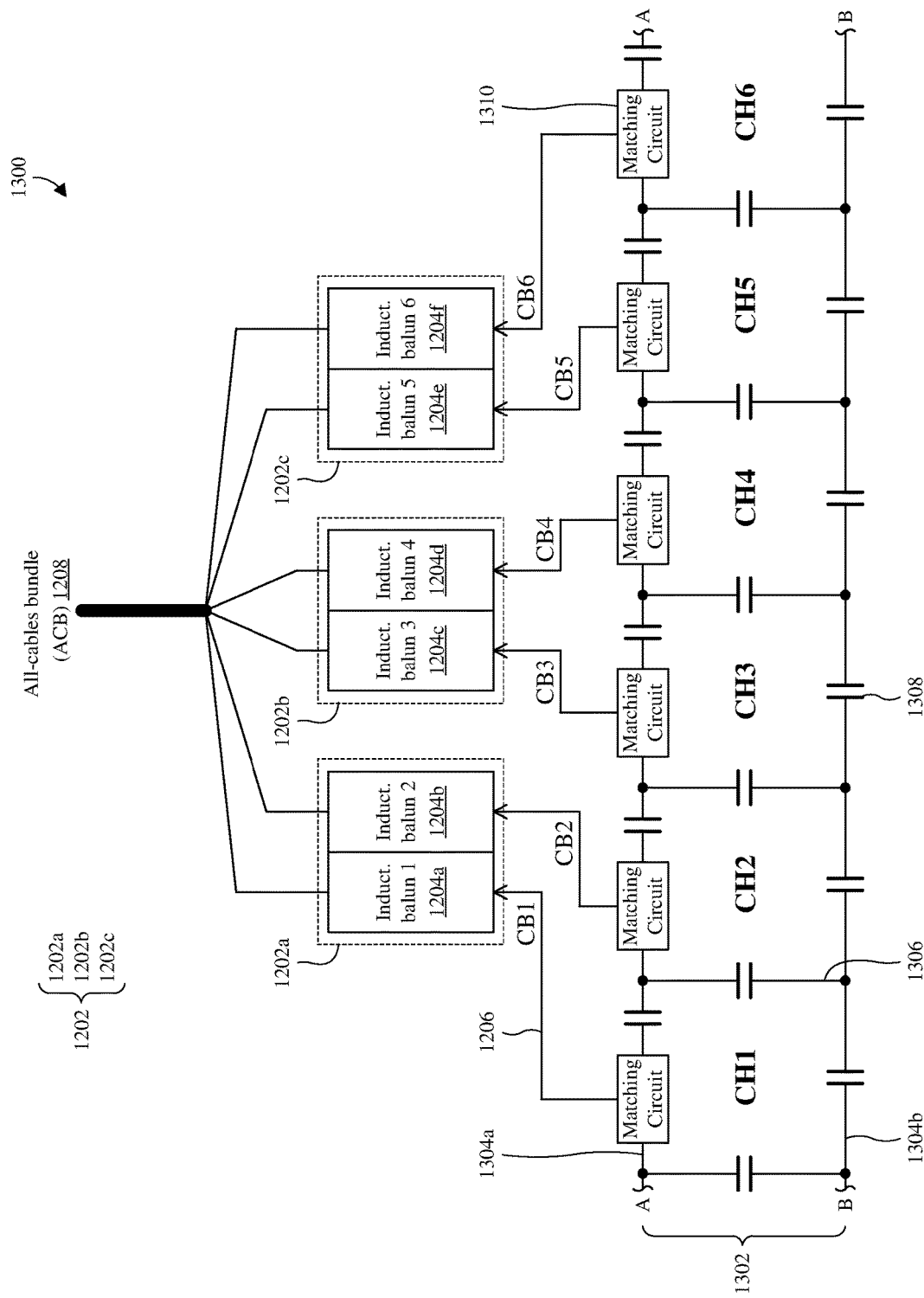
FIG. 13 illustrates a schematic diagram of some embodiments of a birdcage MRI radio frequency (RF) coil comprising multiple balun packages according to aspects of the present disclosure.

With reference to FIG. 13, a schematic diagram 1300 of some embodiments of a birdcage MRI RF coil comprising multiple balun packages 1202 according to aspects of the present disclosure is provided. The birdcage coil comprises multiple channels CH1, CH2, CH3, CH4, CH5, CH6 in a row 1302. In alternative embodiments, the birdcage coil may comprise additional channels and/or additional rows. Note that the row 1302 is flattened for ease of illustration, but practically extends circumferentially around a cylindrical-like volume with the left row end being connected to the right row end at connection points A and B.

The channels CH1-CH6 are formed by a first end ring 1304a, a second end ring 1304b, and a plurality of rungs 1306 extending from the first end ring 1304a to the second end ring 1304b. More specifically, each of the channels CH1-CH6 is formed by corresponding portions of the first and second end rings 1304a, 1304b and by two neighboring ones of the rungs 1306. Further, each of the rungs 1306 is shared by two neighboring ones of the channels CH1-CH6. Capacitors 1308 are on the first and second end rings 1304a, 1304b and on the rungs 1306. The capacitors 1308 resonate with inductances (not shown) of the channels CH1-CH6 at a working frequency (e.g., a Larmor frequency). Additionally, matching circuits 1310 are on the first end ring 1304a and provide locations through which the channels CH1-CH6 electrically couple to an RF coil interface of an MRI system. The channels CH1-CH6 may alternatively be referred to as RF coil elements, meshes, or the like.

The birdcage MRI RF coil is tuned to a degenerate mode at which all resonant modes, except a ring mode in which there are no rung currents flowing, collapse to a same working frequency (e.g., a Larmor frequency). By tuning the birdcage MRI RF coil to the degenerate mode, each of the channels CH1-CH6 has good isolation from each other channel, which allows the birdcage MRI RF coil to be used as pTx coil and/or as a phased array Rx coil. In alternative embodiments, the birdcage MRI RF coil is tuned to the uniform mode and/or is low pass birdcage coil, a high pass birdcage coil, or a bandpass birdcage coil.

Multiple balun packages 1202 are electrically coupled respectively to the matching circuits 1310 by corresponding cable bundles 1206, and each of the multiple balun packages 1202 comprises two inductive cable baluns decoupled from each other according to aspects of the present disclosure. The inductive cable baluns block common mode current along the cable bundles 1206 before the cable bundles 1206 are bundled into an ACB 1208, which is electrically coupled to an RF coil interface of an MRI system. The multiple balun packages 1202 and the corresponding cable bundles 1206 may, for example, be as described with regard to FIG. 12, supposing that m and n are respectively 3 and 5. Further, the multiple balun packages 1202 may, for example, be as described with regard to any of FIGS. 1 to 11.

Decoupling the inductive cable baluns according to aspects of the present disclosure allows multiple inductive cable baluns to be packaged together. This reduces the number of balun packages, which frees up space in the birdcage MRI RF coil, reduces a weight of the birdcage MRI RF coil, and improves user experience. For pTx coils and phased array Rx coils where there can be a large number of channels, this reduction can be substantial.

The multiple balun packages 1202 comprises a first balun package 1202a, a second balun package 1202b, and a third balun package 1202c. The first balun package 1202a comprises a first inductive cable balun 1204a and a second inductive cable balun 1204b. The second balun package 1202b comprises a third inductive cable balun 1204c and a fourth inductive cable balun 1204d. The third balun package 1202c comprises a fifth inductive cable balun 1204e and a sixth inductive cable balun 1204f. The first inductive cable balun 1204a is electrically coupled to the matching circuit of channel CH1 by a first cable bundle (CB1), the second inductive cable balun 1204b is electrically coupled to the matching circuit of channel CH2 by a second cable bundle (CB2), and so on for the third inductive cable balun 1204c, the fourth inductive cable balun 1204d, the fifth inductive cable balun 1204e, and the sixth inductive cable balun 1204f.

Figure 14:
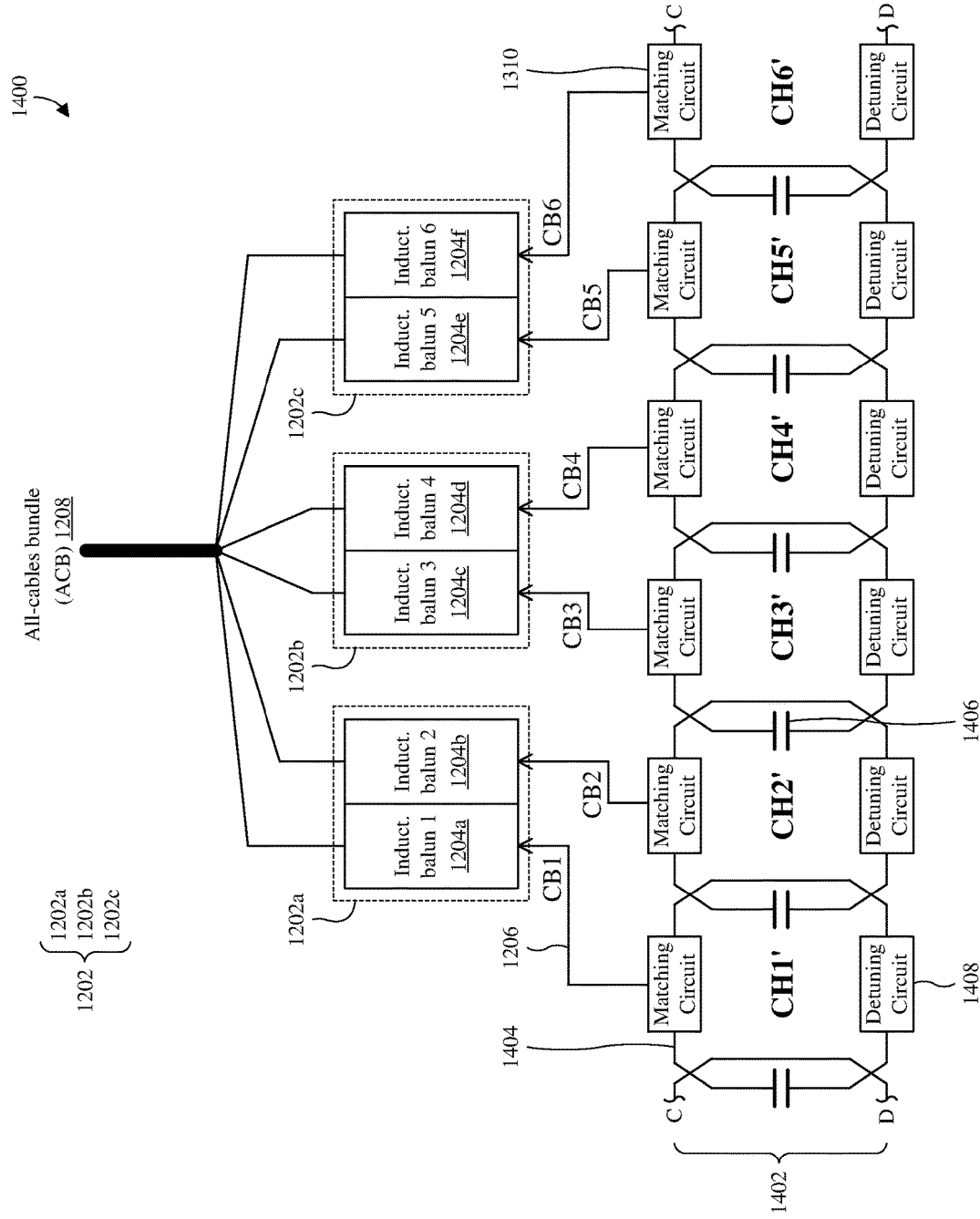
FIG. 14 illustrates a schematic diagram of some embodiments of a phased array MRI RF coil comprising multiple balun packages according to aspects of the present disclosure.

With reference to FIG. 14, a schematic diagram 1400 of some embodiments of a phased array MRI RF coil comprising multiple balun packages 1202 according to aspects of the present disclosure is provided. The phased array MRI RF coil comprises multiple channels CH1', CH2', CH3', CH4', CH5', CH6' in a row 1402. In alternative embodiments, the phased array coil may comprise additional channels and/or additional rows. Note that the row 1402 is flattened for ease of illustration, but practically extends circumferentially around a cylindrical-like volume with the left row end being connected to the right row end at connection points C and D.

The channels CH1'-CH6' are formed from conductive loops 1404 and overlap along the row 1402 for decoupling. Capacitors 1406 are on the conductive loops 1404. The capacitors 1406 resonate with inductances (not shown) of the conductive loops 1404 at a working frequency (e.g., a Larmor frequency). Further, detuning circuits 1408 and matching circuits 1310 are on the conductive loops 1404. In alternative embodiments, the detuning circuits 1408 are omitted. The detuning circuits 1408 may, for example, detune the phased array MRI RF coil in a transmit mode so the coil doesn't resonate at the working frequency in the transmit mode. The matching circuits 1310 provide locations through which the channels CH1'-CH6' electrically couple to an RF coil interface of an MRI system. The channels CH1'-CH6' may alternatively be referred to as RF coil elements or the like.

Multiple balun packages 1202 are electrically coupled respectively to the matching circuits 1310 by corresponding cable bundles 1206 as described with regard to FIG. 13. Decoupling the inductive cable baluns according to aspects of the present disclosure allows multiple inductive cable baluns to be packaged together. This reduces the number of balun packages, which frees up space in the phased array MRI RF coil, reduces a weight of the phased array MRI RF coil, and improves user experience. For phased array Rx coils where there can be a large number of channels, this reduction can be substantial.

Figure 15:
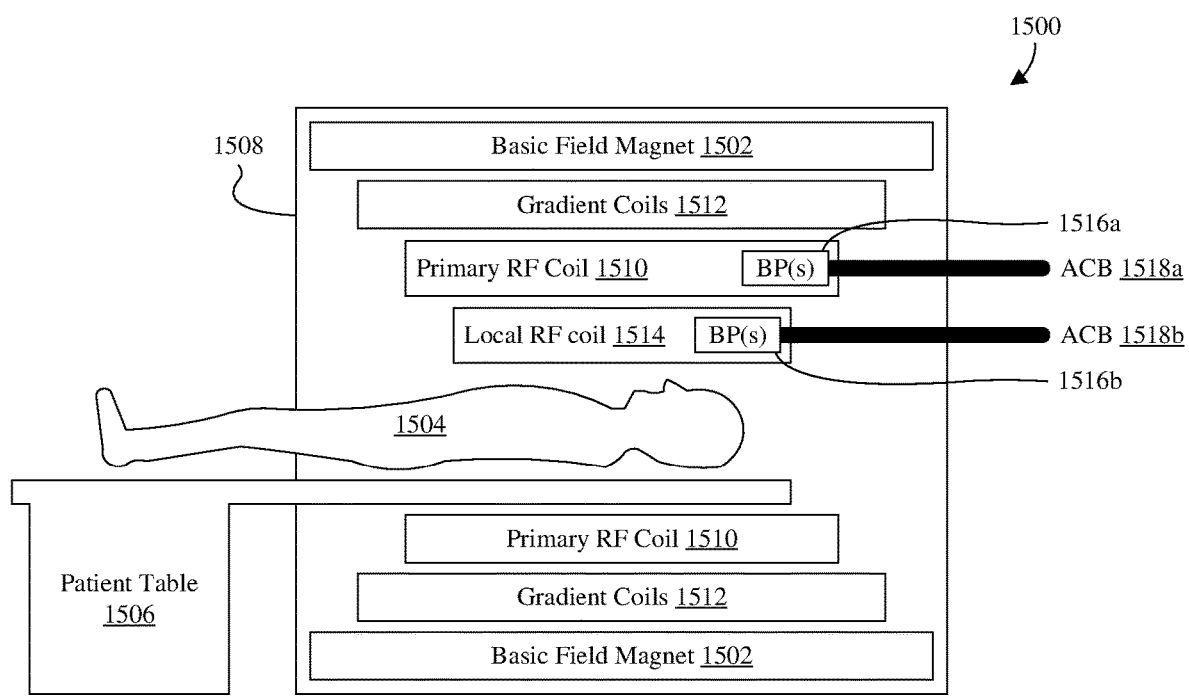
FIG. 15 illustrates a schematic diagram of some embodiments of an MRI scanner comprising a balun package according to aspects of the present disclosure.

With reference to FIG. 15, a schematic diagram 1500 of some embodiments of an MRI scanner comprising one or more balun packages according to aspects of the present disclosure is provided. The MRI scanner uses RF antennas, in the form of RF coils and/or RF coil elements, to transmit and receive RF pulses within a magnetic field generated by a basic field magnet 1502. Further, the received pulses are used to create images of tissue of a patient 1504 to aid in the diagnosis of medical conditions. The patient 1504 may, for example, be positioned on a patient table 1506, within a housing 1508 of the MRI scanner.

In some embodiments, a primary RF coil 1510 (e.g., a whole-body coil (WBC)) operates in conjunction with gradient coils 1512 and serves as a transmission device. However, the primary RF coil 1510 may additionally or alternatively be used as a receive device for imaging large portions of the patient 1504. In place of the primary RF coil 1510, a local RF coil 1514 may be employed to receive RF pulses from the portions of the patient 1504 being imaged. The primary RF coil 1510 may, for example, be or comprise the birdcage MRI RF coil of FIG. 13 and/or may, for example, be or comprise the phased array MRI RF coil of FIG. 14. Similarly, the local RF coil 1514 may, for example, be or comprise the birdcage MRI RF coil of FIG. 13 and/or may, for example, be or comprise the phased array MRI RF coil of FIG. 14.

The primary RF coil 1510 comprises one or more first balun packages 1516a according to aspects of the present disclosure, and the local RF coil 1514 comprises one or more second balun packages 1516b according to aspects of the present disclosure. For example, each balun package may be as in any of FIGS. 1 to 11. This allows a total number of balun packages in each of the primary and local RF coils 1510, 1514 to be reduced as described above. Further, the balun packages filter common current on corresponding cable bundles (not shown), which are then bundled into ACBs (e.g., as shown in FIG. 12). The first balun package(s) 1516a filter cable bundles that are bundled into a first ACB 1518a, and the second balun package(s) 1516b filter cable bundles that are bundled into a second ACB 1518b.

Figure 16:
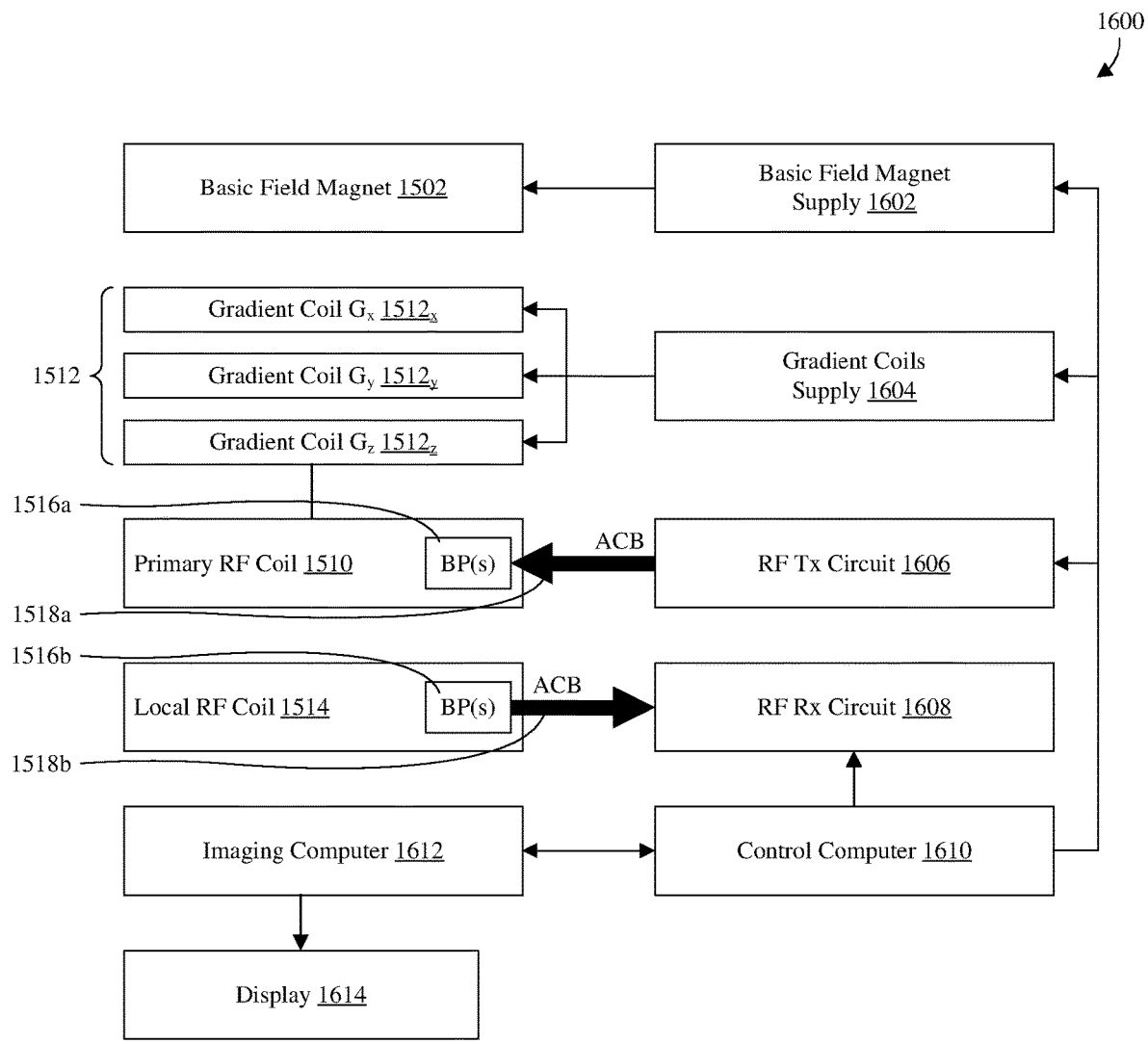
FIG. 16 illustrates a block diagram of some embodiments of an MRI system comprising a balun package according to aspects of the present disclosure.

With reference to FIG. 16, a block diagram 1600 of some embodiments of an MRI system comprising balun packages according to aspects of the present disclosure is provided. One or more basic field magnets 1502 are configured to produce a uniform $B_0$ field and are controlled, at least in part, by and a basic field magnet supply 1602. Gradient coils 1512 are configured to emit gradient magnetic fields like $G_x$ (e.g., via an associated gradient coil $1512_x$), $G_y$ (e.g., via an associated gradient coil $1512_y$), and G, (e.g., via an associated gradient coil $1512_z$). The gradient coils 1512 are controlled, at least in part, by a gradient coils supply 1604. In some examples, the timing, strength, and orientation of the gradient magnetic fields can be controlled, and thus selectively adapted during an MRI procedure.

A primary RF coil 1510 is configured to generate RF pulses. In some embodiments, the primary RF coil 1510 is a WBC. Further, in some embodiments, the primary RF coil 1510 is or comprises the birdcage MRI RF coil of FIG. 13 and/or the phased array MRI RF coil of FIG. 14. The primary RF coil 1510 is controlled, at least in part, by one or more RF transmit circuits 1606. The RF transmit circuit (s) 1606 provide signals to the primary RF coil 1510 through one or more first balun packages 1516a and a first ACB 1518a. The first balun package(s) 1516a filter out common mode current on corresponding cable bundles and each includes two or more inductive cable baluns decoupled according to aspects of the present application. Each balun package may, for example, be as in any of FIGS. 1-11.

A local RF coil 1514 is configured to generate RF pulses and/or to receive resulting magnetic resonance (MR) signals from an object to which the RF pulses are directed. In some embodiments, the local RF coil 1514 is or comprises the birdcage MRI RF coil of FIG. 13 and/or the phased array MRI RF coil of FIG. 14. The local RF coil 1514 is electrically coupled to one or more RF receive circuits 1608. The RF receive circuit(s) 1608 receive signals from the local RF coil 1514 through one or more second balun packages 1516b and a second ACB 1518b. The second balun package (s) 1516b filter out common mode current on corresponding cable bundles and each includes two or more inductive cable baluns decoupled according to aspects of the present application. Each balun package may, for example, be as in any of FIGS. 1-11.

A RF coil configured solely to generate RF pulses can be referred to herein as a Tx antenna (or coil or coil array), while an RF coil configured solely to receive resulting MR signals from an object to which the RF pulses are directed can be referred to herein as an Rx antenna (or coil or coil array). An RF coil configured to both generate RF pulses and receive resulting MR signals can be referred to herein as a Tx/Rx antenna (or coil or coil array). The primary RF coil 1510 may, for example, be a Tx coil, a Rx coil, or a Tx/Rx antenna. Similarly, the local RF coil 1514 may, for example, be a Tx coil, a Rx coil, or a Tx/Rx antenna.

The basic field magnet supply 1602, the gradient coils supply 1604, the RF transmit circuit(s) 1606, and the RF receive circuit(s) 1608 are controlled, at least in part, by a control computer 1610. The MR signals received from the local RF coil 1514 can be employed to generate an image, and thus can be subject to a transformation process like a two-dimensional fast Fourier transform (FFT) that generates pixelated image data. The transformation can be performed by an image computer 1612 or other similar processing device. The image data can then be shown on a display 1614. The RF receive circuit(s) 1608 can be connected with the control computer 1610 or the image computer 1612.

Figure 17:
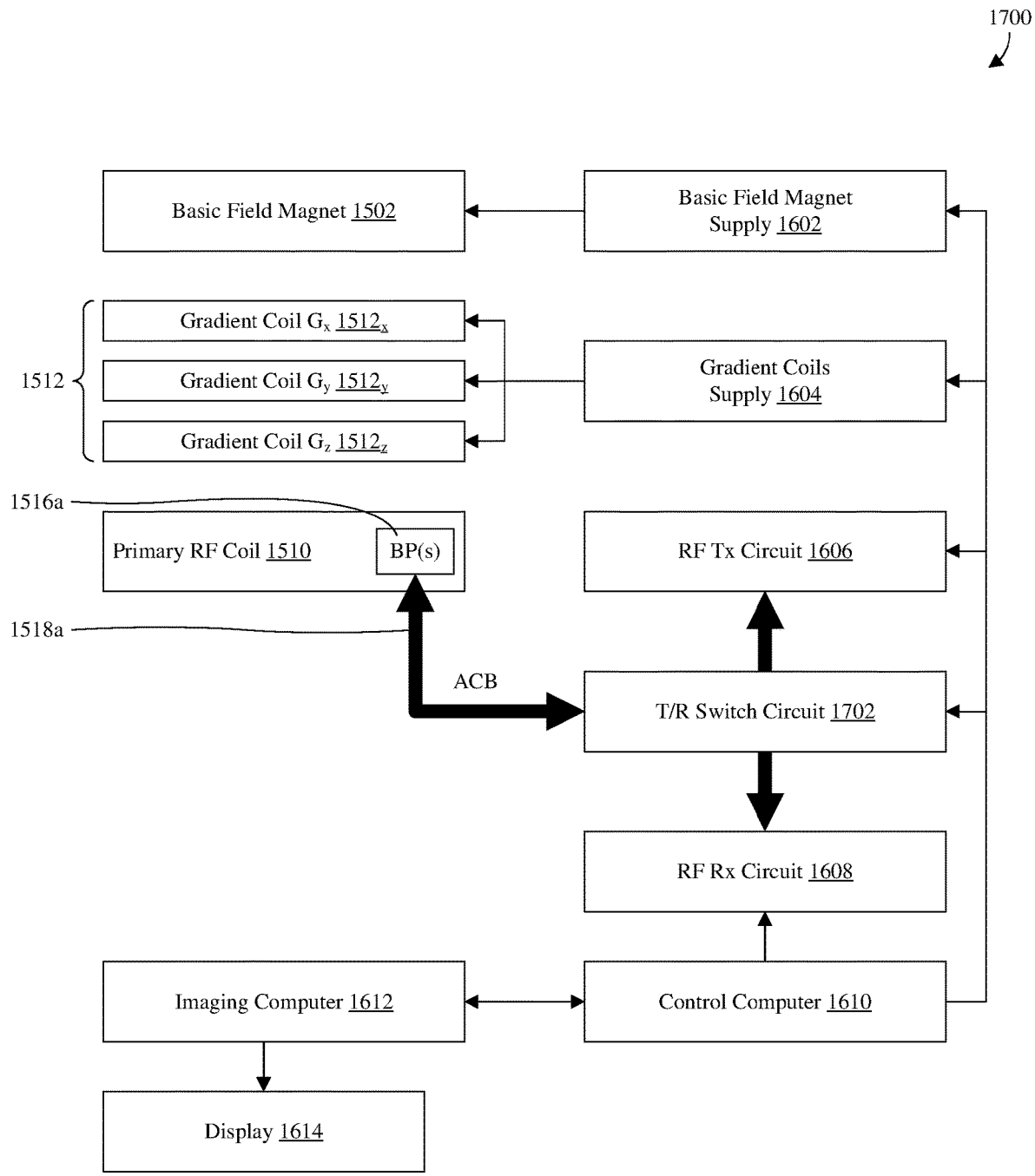
FIG. 17 illustrates a block diagram of some alternative embodiments of the MRI system of FIG. 16 in which the MRI system includes a transmit/receive (T/R) switch circuit.

With reference to FIG. 17, a block diagram 1700 of some alternative embodiments of the MRI system of FIG. 16 is provided in which the MRI system includes a transmit/receive (T/R) switch circuit 1702. The T/R switch circuit 1702 is configured to electrically couple the primary RF coil 1510 to the RF transmit circuit(s) 1606 when the MRI system is in a transmit mode and to the RF receive circuit(s) 1608 when the MRI system is in a receive mode. As such, the primary RF coil 1510 is used for both transmitting RF signals and receiving MR signals. Further, the local RF coil 1514 (see FIG. 16) is omitted.

Figure 18:
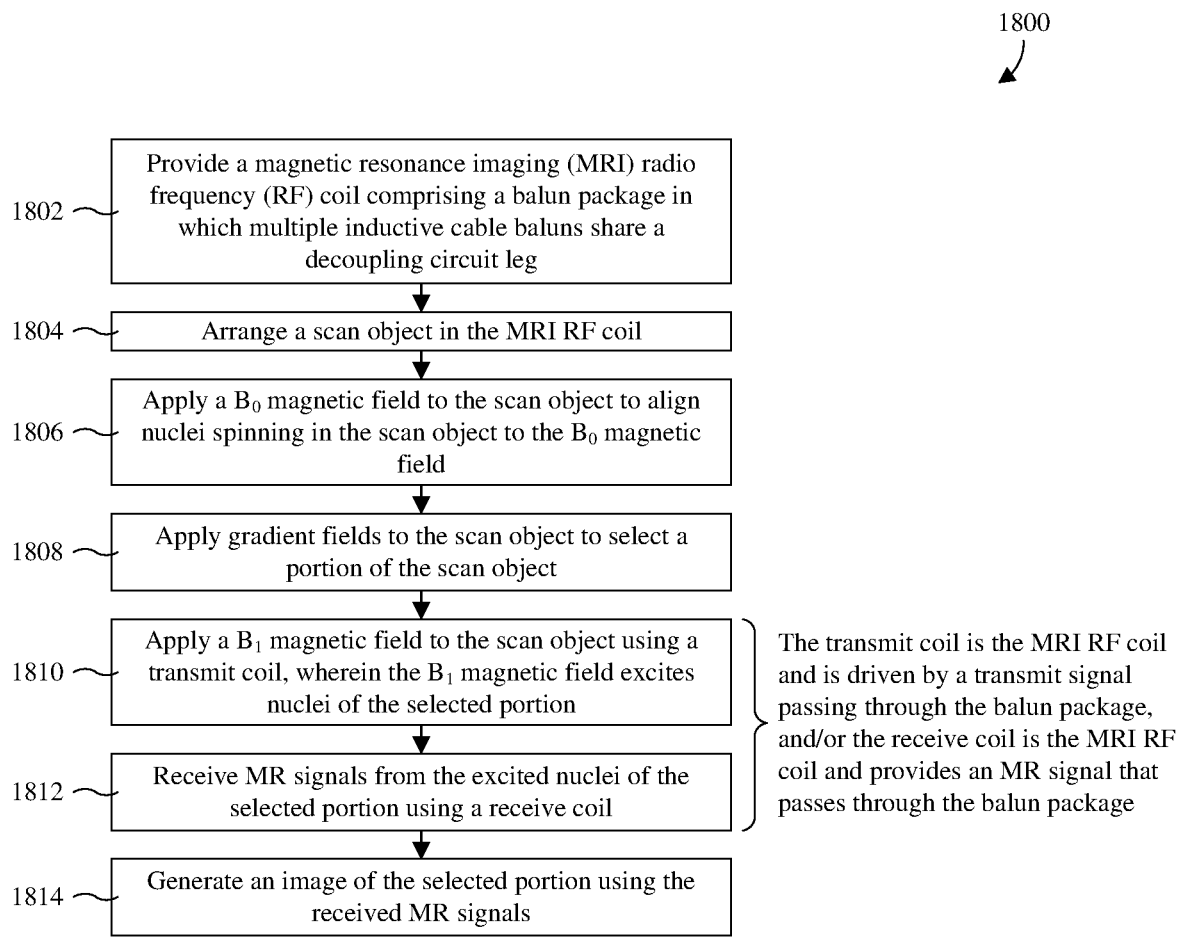
FIG. 18 illustrates a block diagram of some embodiments of a method for performing MRI using an MRI RF coil with a balun package according to aspects of the present disclosure.

With reference to FIG. 18, a block diagram 1800 of some embodiments of a method for performing MRI using an MRI RF coil with a balun package according to aspects of the present disclosure is provided.

At step 1802, an MRI RF coil is provided, wherein the MRI RF coil comprises a balun package in which multiple inductive cable baluns share a decoupling circuit leg. The MRI RF coil may, for example, be the birdcage MRI RF coil of FIG. 13 and/or the phased array MRI RF coil of FIG. 14. The balun package may, for example, be as in any of FIGS. 1 to 11.

At step 1804, a scan object is arranged in the MRI RF coil.

At step 1806, a $B_0$ magnetic field is applied to the scan object to align nuclei spinning in the scan object to the $B_0$ magnetic field.

At step 1808, gradient fields are applied to the scan object to select a portion of the scan object.

At step 1810, a $B_1$ magnetic field is applied to the scan object using a transmit coil, wherein the $B_1$ magnetic field excites nuclei of the selected portion. Further, at step 1812, MR signals are received from the excited nuclei of the selected portion using a receive coil. The transmit coil is the MRI RF coil and is driven by a transmit signal passing through the balun package, and/or the receive coil is the MRI RF coil and provides an MR signal that passes through the balun package.

At step 1814, an image of the selected portion is generated using the received MR signals.

While the method of FIG. 18 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In view of the foregoing, the present disclosure is directed to a balun package comprising multiple inductive cable baluns for MRI.

Example 1 includes a set of inductive cable baluns for a MRI RF coil, the set of inductive cable baluns including: a first resonant circuit and a second resonant circuit, wherein each of the first and second resonant circuits includes an inductor; a first decoupling circuit leg between and shared by the first and second resonant circuits, and including one or more decoupling inductors and/or one or more decoupling capacitors; and a first cable bundle that is wound to form the inductor of the first resonant circuit or is spaced from and inductively coupled to the inductor of the first resonant circuit.

Example 2 includes Example 1, wherein the first and second resonant circuits form individual loops sharing the first decoupling circuit leg.

Example 3 includes any one of Examples 1 to 2, wherein the first cable bundle includes only one coaxial cable or multiple coaxial cables.

Example 4 includes any one of Examples 1 to 3, wherein the first cable bundle is inductively coupled to the inductor of the first resonant circuit and is isolated from the first resonant circuit except for the inductive coupling to the inductor of the first resonant circuit, and wherein the first cable bundle is isolated from the inductor of the second resonant circuit.

Example 5 includes Example 4, wherein the set of inductive cable baluns includes: a second cable bundle inductively coupled to the inductor of the second resonant circuit and isolated from the second resonant circuit except for the inductive coupling to the inductor of the second resonant circuit, and wherein the second cable bundle is isolated from the inductor of the first resonant circuit.

Example 6 includes any one of Examples 4 to 5, wherein the first resonant circuit resonates at a first resonate frequency, and wherein the second resonate circuit resonates at a second frequency that is a same as the first resonate frequency.

Example 7 includes any one of Examples 1 to 3, wherein the first cable bundle has a first winding spaced from and inductively coupled to the inductor of the first resonant circuit and further has a second winding spaced from and inductively coupled to the inductor of the second resonant circuit, and wherein the first and second resonant circuits have different resonant frequencies corresponding to different Larmor frequencies.

Example 8 includes any one of Examples 1 to 3, wherein the first cable bundle is wound to form the inductor of the first resonant circuit and to form the inductor of the second resonant circuit.

Example 9 includes any one of Examples 1 to 8, wherein the first decoupling circuit leg has an impedance that negates reactance induced in the first and second resonant circuits by inductive coupling between the inductor of the first resonant circuit and the inductor of the second resonant circuit.

Example 10 includes a balun package for a MRI RF coil, the balun package including: a first LC circuit and a second LC circuit, wherein the first and second LC circuits have individual resonant frequencies and respectively include a first inductor and a second inductor; a decoupling capacitor or inductor between and shared by the first LC circuit and the second LC circuit; and a first cable bundle having a first winding that forms the first inductor of the first LC circuit or that is spaced from and inductively coupled to the first inductor of the first LC circuit.

Example 11 includes Example 10, wherein the first winding forms the first inductor, and wherein the first cable bundle further has a second winding that forms the second inductor.

Example 12 includes Example 10, wherein the first winding is spaced from and inductively coupled to the first inductor, but not the second inductor, and wherein the balun package includes a second cable bundle that has a second winding that is spaced from and inductively coupled to the second inductor, but not the first inductor.

Example 13 includes Example 10, wherein the first winding is spaced from and inductively coupled to the first inductor, and wherein the first cable bundle further has a second winding that is spaced from and inductively coupled to the second inductor.

Example 14 includes a MRI system, including: a RF coil including a first RF coil element, wherein the first RF coil element includes a first matching circuit; a first resonant loop circuit and a second resonant loop circuit, wherein each of the first and second resonant loop circuits includes an inductor; a first decoupling circuit leg between and shared by the first and second resonant loop circuits, and including one or more decoupling inductors and/or one or more decoupling capacitors; and a first cable bundle extending from the first matching circuit and wound to form the inductor of the first resonant loop circuit or inductively coupled to the inductor of the first resonant loop circuit.

Example 15 includes Example 14 and further includes a T/R switch or a transmit or receive circuit, wherein the first cable bundle is electrically coupled from the first matching circuit to the T/R switch or to the transmit or receive circuit.

Example 16 includes any one of Examples 14 to 15, wherein the first decoupling circuit leg consists essentially of a decoupling capacitor or a decoupling inductor.

Example 17 includes any one of Examples 14 to 16, wherein each of the first and second resonant loop circuits further includes a capacitor, and wherein the first decoupling circuit leg includes a decoupling capacitor or inductor having a first terminal electrically shorted to the inductor of the first resonant loop circuit and the inductor of the second resonant loop circuit, and further having a second terminal electrically shorted to the capacitor of the first resonant loop circuit and the capacitor of the second resonant loop circuit.

Example 18 includes any one of Examples 14 to 17, wherein the RF coil includes a plurality of RF coil elements, including the first RF coil element, and wherein the MRI system includes: a plurality of baluns, including a first balun and a second balun, wherein the first decoupling circuit leg and the first resonant loop circuit form the first balun, and wherein the first decoupling circuit leg and the second resonant loop circuit form the second balun.

Example 19 includes any one of Examples 14 to 18, wherein the RF coil including a second RF coil element, where the second RF coil element includes a second matching circuit, and wherein the MRI system includes: a second cable bundle extending from the second matching circuit and wound to form the inductor of the second resonant loop circuit or inductively coupled to the inductor of the second resonant loop circuit; wherein the first decoupling circuit leg and the first resonant loop circuit form a first balun individual to the first cable bundle, and wherein the first decoupling circuit leg and the second resonant loop circuit form a second balun individual to the second cable bundle.

Example 20 includes Example 19, wherein the RF coil includes a third RF coil element, which includes a third matching circuit, and wherein the MRI system includes: a third resonant loop circuit including an inductor; a second decoupling circuit leg between and shared by the second and third resonant loop circuits, and including one or more additional decoupling inductors and/or one or more additional decoupling capacitors; and a third cable bundle extending from the third matching circuit and wound to form the inductor of the third resonant loop circuit or inductively coupled to the inductor of the third resonant loop circuit.

The following includes definitions of selected terms employed herein. The definitions include various examples or forms of components that fall within the scope of a term and that may be used for implementation. The examples are not intended to be limiting. Both singular and plural forms of terms may be within the definitions.

The terminology used herein is for the purpose of describing particular embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which embodiments belong. It will be further understood that terms (e.g., those defined in commonly used dictionaries) should be interpreted as having a meaning that is consistent with their meaning in the context of the relevant art and will not be interpreted in an idealized or overly formal sense unless expressly so defined herein.

In the above description, some components may be displayed in multiple figures carrying the same reference signs but may not be described multiple times in detail. A detailed description of a component may then apply to that component for all its occurrences.

The detailed descriptions presented herein may be presented in terms of algorithms and symbolic representations of operations on data bits within a memory. These algorithmic descriptions and representations are used by those skilled in the art to convey the substance of their work to others. An algorithm, here and generally, is conceived to be a sequence of operations that produce a result. The operations may include physical manipulations of physical quantities. Usually, though not necessarily, the physical quantities take the form of electrical or magnetic signals capable of being stored, transferred, combined, compared, otherwise manipulated in a logic, and so on. The physical manipulations create a concrete, tangible, useful, real-world result.

It has proven convenient at times, principally for reasons of common usage, to refer to these signals as bits, values, elements, symbols, characters, terms, numbers, and so on. It should be borne in mind, however, that these and similar terms are to be associated with the appropriate physical quantities and are merely convenient labels applied to these quantities. Unless specifically stated otherwise, it is appreciated that throughout the description, terms including processing, computing, calculating, determining, and so on refer to actions and processes of a computer system, logic, processor, or similar electronic device that manipulates and transforms data represented as physical and/or electronic quantities.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional, not illustrated blocks.

What is claimed is:

1. A set of inductive cable baluns for a magnetic resonance imaging (MRI) radio frequency (RF) coil, the set of inductive cable baluns comprising:
   a first resonant circuit and a second resonant circuit, wherein each of the first and second resonant circuits comprises an inductor;
   a first decoupling circuit leg between and shared by the first and second resonant circuits, and including one or more decoupling inductors and/or one or more decoupling capacitors; and
   a first cable bundle that is wound to form the inductor of the first resonant circuit or is spaced from and inductively coupled to the inductor of the first resonant circuit.

2. The set of inductive cable baluns according to claim 1, wherein the first and second resonant circuits form individual loops sharing the first decoupling circuit leg.

3. The set of inductive cable baluns according to claim 1, wherein the first cable bundle comprises only one coaxial cable or multiple coaxial cables.

4. The set of inductive cable baluns according to claim 1, wherein the first cable bundle is inductively coupled to the inductor of the first resonant circuit and is isolated from the first resonant circuit except for the inductive coupling to the inductor of the first resonant circuit, and wherein the first cable bundle is isolated from the inductor of the second resonant circuit.

5. The set of inductive cable baluns according to claim 4, wherein the set of inductive cable baluns comprises:
   a second cable bundle inductively coupled to the inductor of the second resonant circuit and isolated from the second resonant circuit except for the inductive coupling to the inductor of the second resonant circuit, and wherein the second cable bundle is isolated from the inductor of the first resonant circuit.

6. The set of inductive cable baluns according to claim 4, wherein the first resonant circuit resonates at a first resonant frequency, and wherein the second resonant circuit resonates at a second resonant frequency that is a same as the first resonant frequency.

7. The set of inductive cable baluns according to claim 1, wherein the first cable bundle has a first winding spaced from and inductively coupled to the inductor of the first resonant circuit and further has a second winding spaced from and inductively coupled to the inductor of the second resonant circuit, and wherein the first and second resonant circuits have different resonant frequencies corresponding to different Larmor frequencies.

8. The set of inductive cable baluns according to claim 1, wherein the first cable bundle is wound to form the inductor of the first resonant circuit and to form the inductor of the second resonant circuit.

9. The set of inductive cable baluns according to claim 1, wherein the first decoupling circuit leg has an impedance that negates reactance induced in the first and second resonant circuits by inductive coupling between the inductor of the first resonant circuit and the inductor of the second resonant circuit.

10. A balun package for a magnetic resonance imaging (MRI) radio frequency (RF) coil, the balun package comprising:
    a first inductor-capacitor (LC) circuit and a second LC circuit, wherein the first and second LC circuits have individual resonant frequencies and respectively comprise a first inductor and a second inductor;
    a decoupling capacitor or inductor between and shared by the first LC circuit and the second LC circuit; and
    a first cable bundle having a first winding that forms the first inductor of the first LC circuit or that is spaced from and inductively coupled to the first inductor of the first LC circuit.

11. The balun package according to claim 10, wherein the first winding forms the first inductor, and wherein the first cable bundle further has a second winding that forms the second inductor.

12. The balun package according to claim 10, wherein the first winding is spaced from and inductively coupled to the first inductor, but not the second inductor, and wherein the balun package comprises a second cable bundle that has a second winding that is spaced from and inductively coupled to the second inductor, but not the first inductor.

13. The balun package according to claim 10, wherein the first winding is spaced from and inductively coupled to the first inductor, and wherein the first cable bundle further has a second winding that is spaced from and inductively coupled to the second inductor.

14. A magnetic resonance imaging (MRI) system, comprising:
    a radio frequency (RF) coil comprising a first RF coil element, wherein the first RF coil element comprises a first matching circuit;
    a first resonant loop circuit and a second resonant loop circuit, wherein each of the first and second resonant loop circuits comprises an inductor;
    a first decoupling circuit leg between and shared by the first and second resonant loop circuits, and including one or more decoupling inductors and/or one or more decoupling capacitors; and
    a first cable bundle extending from the first matching circuit and wound to form the inductor of the first resonant loop circuit or inductively coupled to the inductor of the first resonant loop circuit.

15. The MRI system according to claim 14, comprising:
    a transmit/receive (T/R) switch or a transmit or receive circuit, wherein the first cable bundle is electrically coupled from the first matching circuit to the T/R switch or to the transmit or receive circuit.

16. The MRI system according to claim 14, wherein the first decoupling circuit leg consists essentially of a decoupling capacitor or a decoupling inductor.

17. The MRI system according to claim 14, wherein each of the first and second resonant loop circuits further comprises a capacitor, and wherein the first decoupling circuit leg comprises a decoupling capacitor or inductor having a first terminal electrically shorted to the inductor of the first resonant loop circuit and the inductor of the second resonant loop circuit, and further having a second terminal electrically shorted to the capacitor of the first resonant loop circuit and the capacitor of the second resonant loop circuit.

18. The MRI system according to claim 14, wherein the RF coil comprises a plurality of RF coil elements, including the first RF coil element, and wherein the MRI system comprises:
   a plurality of baluns, including a first balun and a second balun, wherein the first decoupling circuit leg and the first resonant loop circuit form the first balun, and wherein the first decoupling circuit leg and the second resonant loop circuit form the second balun.

19. The MRI system according to claim 14, wherein the RF coil comprises a second RF coil element, where the second RF coil element comprises a second matching circuit, and wherein the MRI system comprises:
   a second cable bundle extending from the second matching circuit and wound to form the inductor of the second resonant loop circuit or inductively coupled to the inductor of the second resonant loop circuit;
   wherein the first decoupling circuit leg and the first resonant loop circuit form a first balun individual to the first cable bundle, and wherein the first decoupling circuit leg and the second resonant loop circuit form a second balun individual to the second cable bundle.

20. The MRI system according to claim 19, wherein the RF coil comprises a third RF coil element, which comprises a third matching circuit, and wherein the MRI system comprises:
   a third resonant loop circuit comprising an inductor;
   a second decoupling circuit leg between and shared by the second and third resonant loop circuits, and including one or more additional decoupling inductors and/or one or more additional decoupling capacitors; and
   a third cable bundle extending from the third matching circuit and wound to form the inductor of the third resonant loop circuit or inductively coupled to the inductor of the third resonant loop circuit.

* * * * *